United States Patent
Lee et al.

(10) Patent No.: US 8,257,549 B2
(45) Date of Patent: Sep. 4, 2012

(54) SPIN HEAD, CHUCK PIN USED IN THE SPIN HEAD, AND METHOD FOR TREATING A SUBSTRATE WITH THE SPIN HEAD

(75) Inventors: Woo-Seok Lee, Cheonan-si (KR); Woo-Young Kim, Cheonan-si (KR); Jeong-Yong Bae, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 885 days.

(21) Appl. No.: 12/222,149

(22) Filed: Aug. 4, 2008

(65) Prior Publication Data

US 2009/0093123 A1   Apr. 9, 2009

(30) Foreign Application Priority Data

Oct. 8, 2007   (KR) .................... 10-2007-0101075

(51) Int. Cl.
 *H01L 21/306* (2006.01)
(52) U.S. Cl. ............... 156/345.55; 118/730; 118/728; 156/345.51; 156/345.23; 438/706; 438/745; 134/157; 257/E21.219
(58) Field of Classification Search ............ 156/345.55, 156/345.51, 345.23; 118/730, 728; 438/706, 438/745; 134/157; 257/E21.219, E21.226, 257/E21.228
See application file for complete search history.

(56) References Cited

U.S. PATENT DOCUMENTS

| | | | |
|---|---|---|---|
| 6,964,419 B2 * | 11/2005 | Jan | 279/106 |
| 2004/0031503 A1 * | 2/2004 | Eitoku | 134/2 |
| 2007/0065267 A1 | 3/2007 | Gueler | |
| 2008/0061519 A1 * | 3/2008 | Cho et al. | 279/106 |
| 2009/0093123 A1 * | 4/2009 | Lee et al. | 438/706 |

FOREIGN PATENT DOCUMENTS

| | | |
|---|---|---|
| JP | 08-290095 | 11/1996 |
| JP | 10-199964 | 7/1998 |
| JP | 11-040655 | 2/1999 |
| JP | 11-060655 | 2/1999 |
| JP | 11-163094 | 6/1999 |

(Continued)

OTHER PUBLICATIONS

Machine Generated English Translation of JP 2001-070894 published Mar. 21, 2001.*

(Continued)

*Primary Examiner* — Sylvia R. MacArthur
(74) *Attorney, Agent, or Firm* — Harness, Dickey & Pierce, P.L.C.

(57) ABSTRACT

Provided is a spin head for supporting a substrate. The spin head includes a rotatable body, and chuck pins protruding upward from the body and configured to support an edge of a substrate placed at the body when the body is rotated. Each of the chuck pins includes a vertical rod vertically disposed at the body, and a support rod extending from a side of the vertical rod and configured to make contact with the edge of the substrate placed at the body when the body is rotated. When the substrate is rotated, the vertical rod is spaced apart from the edge of the substrate. The contact portion includes a streamlined side surface. The support rod includes a contact portion. The contact portion tapers toward the end of the support rod when viewed from the top of the support rod.

33 Claims, 25 Drawing Sheets

FOREIGN PATENT DOCUMENTS

| | | |
|---|---|---|
| JP | 2000-208591 | 7/2000 |
| JP | 2001-044159 | 2/2001 |
| JP | 2001-070894 | 3/2001 |
| JP | 2003-085988 | 3/2003 |
| JP | 2003-086566 | 3/2003 |
| JP | 2003-229399 | 8/2003 |
| JP | 2006-190448 | 7/2006 |
| JP | 2007-141449 | 6/2007 |
| KR | 2006-0059055 | 6/2006 |
| KR | 2007-0011308 | 1/2007 |

OTHER PUBLICATIONS

Machine Generated English Translation of JP 2003-229399 published Aug. 15, 2003.*

* cited by examiner

SPIN HEAD, CHUCK PIN USED IN THE SPIN HEAD, AND METHOD FOR TREATING A SUBSTRATE WITH THE SPIN HEAD

CROSS-REFERENCE TO RELATED APPLICATIONS

This U.S. non-provisional patent application claims priority under 35 U.S.C. §119 of Korean Patent Application No. 10-2007-0101075, filed on Oct. 8, 2007, the entire contents of which are hereby incorporated by reference.

BACKGROUND OF THE INVENTION

The present invention disclosed herein relates to an apparatus for treating a substrate, and more particularly, to a rotatable spin head configured to support a substrate, for example, in a semiconductor process, and a method for treating a substrate using the spin head.

Semiconductor processes include a process of etching or cleaning thin layers, foreign substances, and particles. Such an etching or cleaning process may be performed by placing a substrate such as a wafer on a spin head with a patterned side of the wafer facing upward or downward and supplying a process liquid to the wafer while rotating the spin head. The spin head includes chuck pins to support the edge of the wafer for preventing the wafer from being detached from the spin head in a radial direction. The chuck pins can be moved between rest positions and supporting positions. When the chuck pins are in the rest positions, a loading/unloading space is formed on the spin head for loading and unloading a substrate. When a substrate loaded on the spin head is treated while rotating the spin head, the chuck pins are in supporting positions where the chuck pins make contact with the edge of the substrate and support the substrate.

FIG. 23 illustrates a typical spin head 900. The spin head 900 includes a rotatable body 920, support pins 960 configured to support a bottom surface of a substrate (W), and chuck pins 940 configured to support the edge of the substrate (W). Each of the chuck pins 940 includes a rotatable vertical rod 942 and a support rod 944 protruding upward from the vertical rod 942. The support rod 944 and the vertical rod 942 are eccentric. A process liquid is supplied to a front center portion of the substrate (W), and gas is supplied to the bottom surface of the substrate (W) to prevent the process liquid from reaching a predetermined region of the bottom surface of the substrate (W).

FIG. 24 is a top view for explaining disadvantages of chuck pins such as the chuck pins 940 of FIG. 23. The vertical rods 942 are disposed close to the substrate (W), and the support rods 944 have a circular shape. Therefore, when the substrate (W) is rotated, streams flowing from the front center portion of the substrate (W) are largely separated at the support rods 944. That is, a process liquid is not smoothly supplied to regions of the substrate (W) close to the support rods 944.

FIG. 25 is a bottom view of the substrate (W) for explaining disadvantages of support pins such as the support pins 960 of FIG. 23. In the case where the support pins 960 are disposed between the substrate (W) and the rotatable body 920 as shown in FIG. 23, streams of gas supplied to a bottom surface of the substrate (W) are separated at the support pins 960. Therefore, gas is not sufficiently supplied to regions of the bottom surface of the substrate (W) close to the support pins 960, and thus a process liquid can permeate between the substrate (W) and the rotatable body 920 past the support pins 960. As a result, an edge portion of the bottom surface of the substrate (W) may be non-uniformly treated. In addition, since the vertical rods 942 of the chuck pins 940 impede streams of gas supplied to the bottom surface of the substrate (W), a process liquid can permeate between the substrate (W) and the rotatable body 920 past the vertical rods 942.

In general, the support rods 944 are moved together from rest positions to supporting positions by a single driving mechanism. Therefore, if the support rods 944 are not uniform in size due to machining tolerances, some of the support rods 944 may not be brought into contact with the edge of the substrate (W) although all the support rods 944 are moved together to the supporting positions. Thus, the substrate (W) may be unstably supported, and the other chuck pins making contact with the edge of the substrate (W) may be easily damaged due to concentration of stress.

In addition, if the spin head 900 is rotated at high speed, since a strong centrifugal force is applied to the support rods 944 in a direction from the supporting positions to the rest positions, the substrate (W) may be unstably supported.

SUMMARY OF THE INVENTION

The present invention provides a spin head configured to uniformly supply a process liquid to the top surface of a substrate, and a method for treating a substrate using the spin head.

The present invention also provides a spin head configured to uniformly treat a bottom edge region of a substrate using a cleaning liquid that is directed to the bottom surface of the substrate after being used to treat the top surface of the substrate, and a method for treating a substrate using the spin head.

The present invention also provides a spin head having a structure for stably keeping all chuck pins in contact with a substrate.

The present invention also provides a spin head having a structure for stably keeping all chuck pins in contact with an edge portion of a substrate at high speed.

Objects of the present invention are not limited to those mentioned above, and other objects of the present invention will be apparently understood by those skilled in the art through the following description.

Embodiments of the present invention provide spin heads for supporting a substrate. The spin head include a rotatable body, and chuck pins protruding upward from the body and configured to support an edge of a substrate placed at the body when the body is rotated. Each of the chuck pins includes a vertical rod vertically disposed at the body, and a support rod extending from a side of the vertical rod and configured to make contact with the edge of the substrate placed at the body when the body is rotated.

In some embodiments, the support rod may include a contact portion extending to an end of the support rod and tapering toward the end of the support rod when viewed from a top of the support rod. The contact portion may include a rounded side surface in a length direction of the support rod. The contact portion may include a streamlined side surface in a length direction of the support rod. The support rod may have a uniform height from a top surface of the body in a length direction of the support rod. The support rod may include a distal end that is viewed as a point when viewed from the top of the support rod.

In other embodiments, the support rod may include a horizontal rod extending laterally from the vertical rod, and a contact rod bent downward from an end of the horizontal rod. The contact rod may have the same cross section along a length of the contact rod. The contact rod may taper away from the vertical rod. The contact rod may include a streamlined side surface. The vertical rod may have a circular section, and the contact rod may have a width smaller than a diameter of the circular section of the vertical rod when viewed from a top of the contact rod.

In still other embodiments, the spin head may further include a chuck pin moving unit configured to move the chuck pins in radial directions of the body. The chuck pin moving unit may include: movable rods fixed to the chuck pins; a rotatable cam including protrusions on an outer surface thereof so as to move the chuck pins away from a center of the body; and chuck pin return units applying forces to the movable rods, respectively, so as to individually move the chuck pins toward the center of the body.

In even other embodiments, the chuck pin moving unit may further include contact maintaining members configured to push the chuck pins toward the center of the body when the body is rotated so as to prevent the chuck pins from moving away from the center of the body by a centrifugal force.

In yet other embodiments, the body may include a lower nozzle member through which gas is injected so as to space the substrate apart from the body. The lower nozzle member may include an injection hole formed in a top surface of the body into a circular shape. The lower nozzle member may further include: a passage portion connected to a gas supply conduit and having the same cross section along a length thereof; and an injection portion extending upward from the passage portion and connected to the injection hole, the injection portion having a gradually increasing cross section along an upward direction.

In other embodiments of the present invention, there are provided chuck pins used in a rotatable spin head for supporting an edge of a substrate. The chuck pins include a vertical rod disposed in a vertical direction, and a support rod extending from a side of the vertical rod.

In some embodiments, the support rod may include a contact portion extending to an end of the support rod in a tapered shape. The contact portion may include a rounded side surface in a length direction of the support rod. The contact portion may include a streamlined side surface. The support rod may have a uniform height in a length direction thereof.

In other embodiments, the support rod may include a horizontal rod extending laterally from the vertical rod, and a contact rod bent downward from an end of the horizontal rod. The contact rod may taper away from the vertical rod. The contact rod may have the same cross section along a length of the contact rod. The contact rod may include a streamlined side surface.

In still other embodiments of the present invention, there are provided methods for treating a substrate. The methods include supporting a substrate placed at a body of a spin head by brining chuck pins into contact with an edge of the substrate, wherein each of the chuck pins includes a vertical rod vertically disposed at the body and a support rod extending from a side of the vertical rod, wherein when the chuck pin supports the substrate, the vertical rod is spaced apart from the substrate in a lateral direction, and a distal end of the support rod is brought into contact with the edge of the substrate.

In some embodiments, the support rod may include a contact portion extending to an end of the support rod in a tapered shape when viewed from a top of the support rod, and the contact portion may be horizontally disposed at the same height as the substrate placed at the spin head.

In other embodiments, the support rod may include a horizontal rod extending laterally from the vertical rod, and a contact rod bent downward from an end of the horizontal rod, wherein the horizontal rod is horizontally disposed higher than the substrate placed at the spin head, and the contact rod extends downward to a level of the substrate placed at the spin head or lower than the level of the substrate placed at the spin head. The contact rod may taper away from the vertical rod when viewed form a top of the contact rod. The contact rod may have the same cross section along a length thereof.

In still other embodiments, the substrate may be placed at the spin head with a patterned side of the substrate facing downward, and a process liquid may be supplied to a top center portion of the substrate when the spin head is rotated.

In even other embodiments, the substrate may be spaced a predetermined distance from the spin head by a pressure of gas injected upward from the spin head.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to FIGS. 1 through 22. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the following descriptions of embodiments, an apparatus for cleaning a substrate (W) using a chemical, a rinsing liquid, and a dry gas is described as an example. That is, the spirit and scope of the present invention is not limited to the exemplary substrate cleaning apparatus. The present invention can be applied to various apparatuses such as an etching apparatus that processes a substrate while rotating the substrate.

Figure 1:
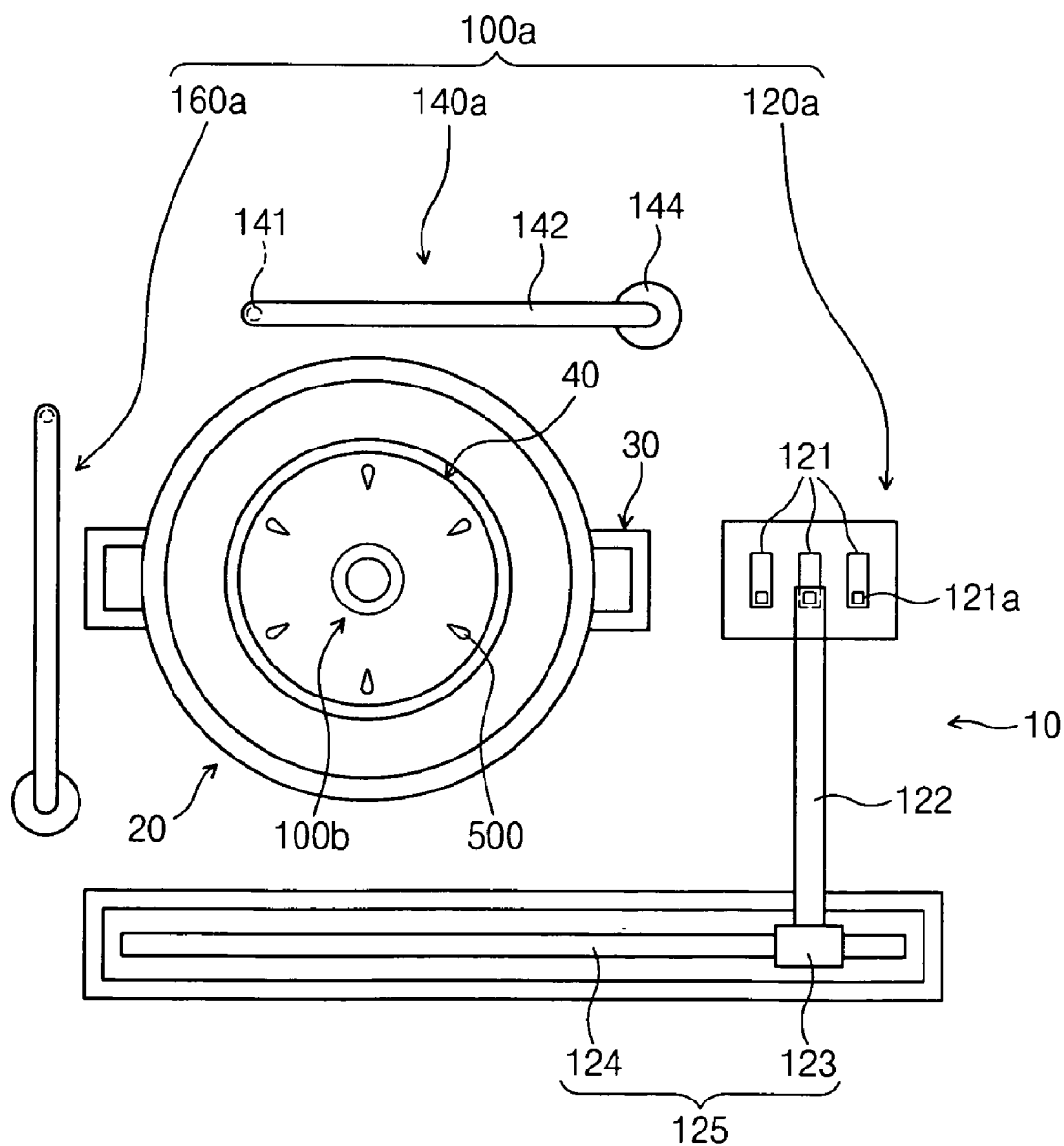
FIG. 1 is a schematic plan view illustrating a substrate treating apparatus according to an embodiment of the present invention.

FIG. 1 is a schematic plan view illustrating a substrate treating apparatus 1 according to an embodiment of the present invention. Referring to FIG. 1, the substrate treating apparatus 1 includes a fluid supply unit 10, a container 20, a lifting unit 30, and a spin head 40. The fluid supply unit 10 supplies a process liquid or gas to a substrate (W) for treating the substrate (W). The spin head 40 supports and rotates the substrate (W) during a process. The substrate (W) is placed at the spin head 40 with a patterned side of the substrate (W) facing downward. Alternatively, the substrate (W) may be placed at the spin head 40 with a patterned side of the substrate (W) facing upward. The container 20 prevents process chemicals and waste fumes from splashing out or leaking out. The lifting unit 30 is used to move the spin head 40 or the container 20 in a vertical direction so as to adjust the relative height between the container 20 and the spin head 40.

The fluid supply unit 10 includes an upper nozzle member 100a and a lower nozzle member 100b. The upper nozzle member 100a supplies a process liquid or a process gas to a top center portion of a substrate (W) placed at the spin head 40, and the lower nozzle member 100b supplies gas to a bottom surface of the substrate (W). The substrate (W) is spaced a predetermined distance apart from a top surface of the spin head 40. The lower nozzle member 100b supplies gas to a gap between the substrate (W) and the spin head 40. The gas may be nitrogen gas. Alternatively, the gas may be an inert gas or clean air. The process liquid or process gas supplied through the upper nozzle member 100a to the top center portion of the substrate (W) is spread toward the edge of the substrate (W) by a centrifugal force. Then, the process liquid or process gas flows toward a bottom surface region of the substrate (W). Gas is supplied to a center portion of the bottom surface of the substrate (W) through the lower nozzle member 100b so as to prevent the process liquid or process gas from reaching a predetermined region of the bottom surface of the substrate (W). Therefore, the entire top surface of the substrate (W) and a bottom edge portion of the substrate (W) are treated by the process liquid or the process gas. The substrate (W) is spaced a predetermined distance from the spin head 40 by the pressure of gas supplied through the lower nozzle member 100b. The substrate (W) is placed at the spin head 40 with the bottom surface of the substrate (W) being spaced apart from the spin head 40.

The upper nozzle member 100a includes a chemical supply nozzle 120a, a rinsing liquid supply nozzle 140a, and a dry gas supply nozzle 160a. The chemical supply nozzle 120a supplies a plurality of chemicals to the substrate (W). The chemical supply nozzle 120a includes a plurality of injectors 121, a support bar 122, and a bar mover 125. The injectors 121 are disposed at a side of the container 20. The injectors 121 are respectively connected to chemical tanks (not shown) for receiving chemicals from the chemical tanks. The chemical tanks connected to the injectors 121 store different chemicals. The injectors 121 are arranged in a predetermined direction in parallel with each other. The injectors 121 include upward protrusions 121a, respectively. Grooves (not shown) may be formed in side portions of the protrusions 121a, respectively. The chemical may be sulfuric acid, nitric acid, ammonia, hydrofluoric acid, or a mixture of deionized water and one or more of the listed chemicals. A discharge hole is formed in an end of each of the injectors 121.

The support bar 122 is coupled to one of the injectors 121 for moving the injectors 121 above the substrate (W) placed on the spin head 40. The support bar 122 is shaped like a long rod and is disposed in a manner such that the length of the support bar 122 is perpendicular to the arranged direction of the injectors 121. A holder (not shown) is attached to a bottom surface of the support bar 122 for coupling the support bar 122 and the injectors 121. The holder includes arms (not shown), and the arms are insertable into the grooves formed in the protrusions 121a of the injectors 121. The arms may be rotatable or movable into the grooves.

The bar mover 125 moves the support bar 122 along a linear path between a position above the support bar 122 and a position above the substrate (W) placed on the spin head 40. The bar mover 125 includes a bracket 123, a guide rail 124, and a driving unit (not shown). The guide rail 124 extends straight along the injectors 121 and the container 20 from the outside of the injectors 121 to the outside of the container 20. The bracket 123 is coupled to the guide rail 124 and is movable on the guide rail 124. The support bar 122 is fixed to the bracket 123. The driving unit provides a driving force for moving the bracket 123 linearly. The bracket 123 may be linearly moved using a motor and a screw. Alternatively, the bracket 123 may be linearly moved using a belt, a pulley, and a motor. Alternatively, the bracket 123 may be linearly moved using a linear motor.

The rinsing liquid supply nozzle 140a is disposed at another side of the container 20, and the dry gas supply nozzle 160a is disposed at another side of the container 20. The rinsing liquid supply nozzle 140a includes an injector 141, a support bar 142, and a driving unit 144. The injector 141 is fixed to an end of the support bar 142. A rotation shaft (not shown) is fixed to the other end of the support bar 142, and the driving unit 144 rotates the rotation shaft. The injector 141 receives a rinsing liquid from a rinsing liquid tank (not shown). The dry gas supply nozzle 160a has a structure similar to that of the rinsing liquid supply nozzle 140a. The dry gas supply nozzle 160a is used to supply isopropyl alcohol and nitrogen gas. The nitrogen gas may be supplied through the dry gas supply nozzle 160a at a high temperature. The lower nozzle member 100b will be described later in detail.

Figure 2:
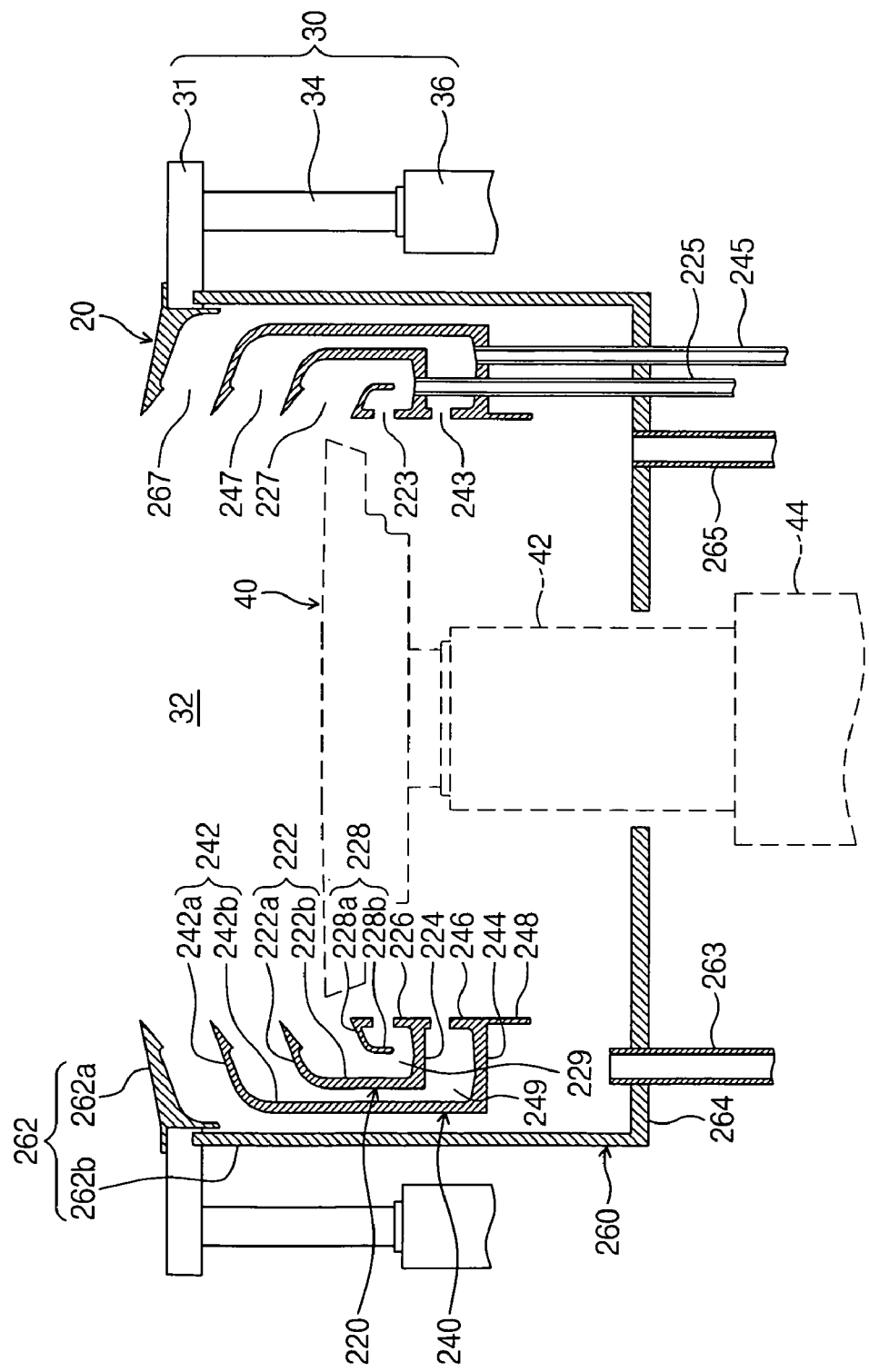
FIG. 2 is a cross-sectional view illustrating a container according to an embodiment of the present invention.
Figure 3:
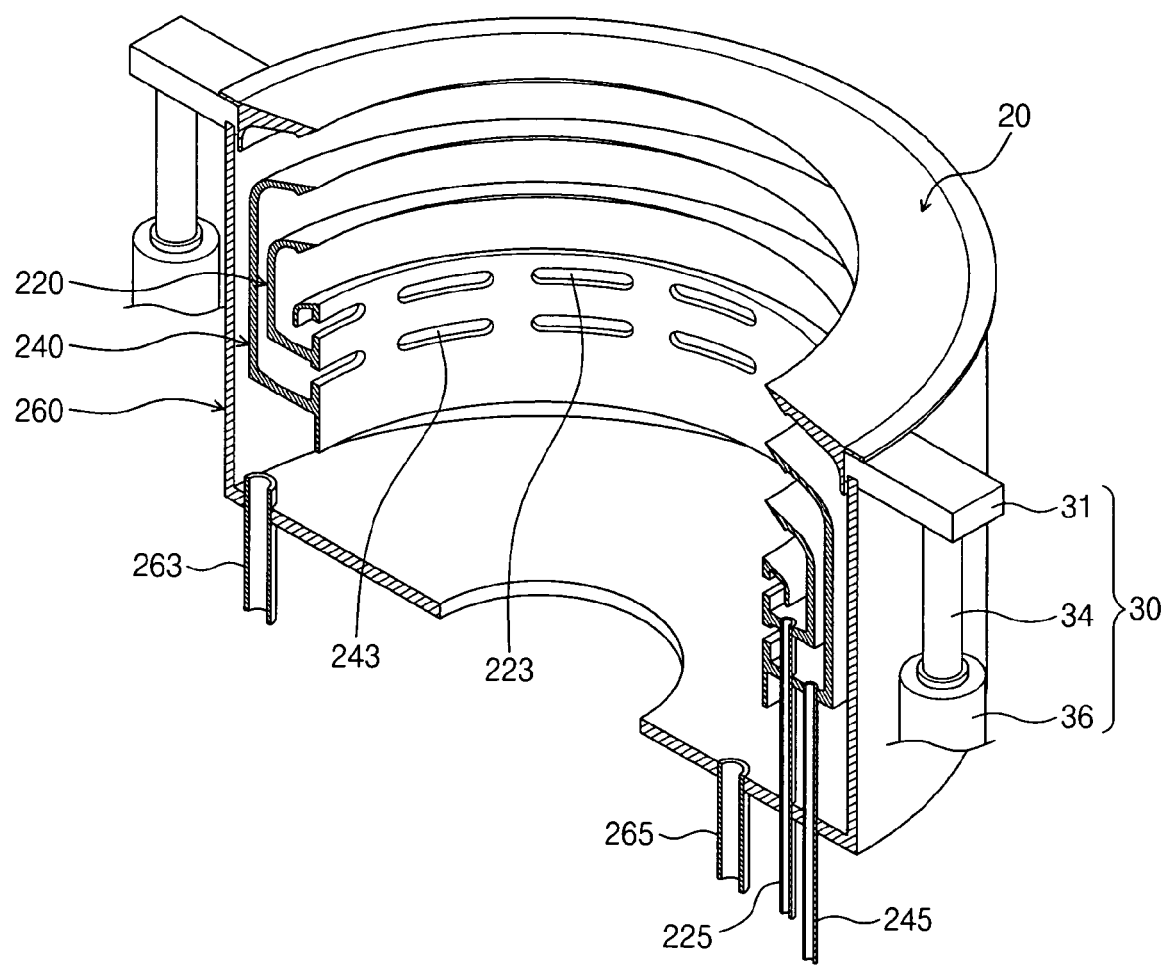
FIG. 3 is a vertical cut-away view of the contained of FIG. 2, according to an embodiment of the present invention.

FIG. 2 is a cross-sectional view illustrating the container 20 according to an embodiment of the present invention, and FIG. 3 is a vertical cut-away view illustrating the contained 20 according to an embodiment of the present invention. Referring to FIGS. 2 and 3, the container 20 has a space 32 with an opened top, and the spin head 40 is disposed in the space 32 for treating a substrate (W). A rotation shaft 42 is fixed to a bottom surface of the spin head 40 for supporting and rotating the spin head 40. The rotation shaft 42 is inserted through an opening formed through a bottom surface of the container 20 and protrudes outward from the container 20. A driving unit 44 such as a motor is fixedly coupled to the rotation shaft 42 for rotating the rotation shaft 42.

FIG. 3 is a cut-away view illustrating the inside structure of the container 20. Referring to FIGS. 2 and 3, the container 20 is configured to collect chemicals separately after the chemicals are used for treating the substrate (W). Thus, the chemicals can be reused. The container 20 includes a plurality of collecting vessels 220, 240, and 260. Process liquids are separately collected to the collecting vessels 220, 240, and 260 after the process liquids are used. In the current embodiment, the container 20 includes three collecting vessels 220, 240, and 260. Hereinafter, the three collecting vessels 220, 240, and 260 will be also referred as an inner collecting vessel, a middle collecting vessel, and an outer collecting vessel, respectively.

The inner collecting vessel 220 is shaped like a ring for enclosing the spin head 40. The middle collecting vessel 240 is shaped like a ring for enclosing the inner collecting vessel 220. The outer collecting vessel 260 is shaped like a ring for enclosing the middle collecting vessel 240. The collecting vessels 220, 240, and 260 include inlets 227, 247, and 267, respectively. The inlets 227, 247, and 267 communicate with the space 32 of the container 20. Each of the inlets 227, 247, and 267 is shaped like a ring enclosing the spin head 40. Chemicals injected to the substrate (W) are directed to the inlets 227, 247, and 267 by a centrifugal force generated by rotation of the substrate (W) and then are collected to the collecting vessels 220, 240, and 260. The inlet 267 of the outer collecting vessel 260 is located above the inlet 247 of the middle collecting vessel 240, and the inlet 247 of the middle collecting vessel 240 is located just above the inlet 227 of the inner collecting vessel 220. That is, the inlets 227, 247, and 267 of the inner, middle, and outer collecting vessels 220, 240, and 260 are disposed at different heights.

The inner collecting vessel 220 includes an outer wall 222, a bottom wall 224, an inner wall 226, and a guide wall 228. Each of the outer wall 222, the bottom wall 224, the inner wall 226, and the guide wall 228 is shaped like a ring. The outer wall 222 includes an oblique wall 222a and a vertical wall 222b. The oblique wall 222a is sloped down in a direction away from the spin head 40. The vertical wall 222b extends downward from the oblique wall 222a. The bottom wall 224 extends horizontally from a lower edge of the vertical wall 222b toward the spin head 40. An end of the bottom wall 224 is aligned with a top end of the oblique wall 222a. The inner wall 226 extends vertically upwardly from the end of the bottom wall 224. A top end of the inner wall 226 is spaced a predetermined distance from the top end of the oblique wall 222a. A gap between the vertically space inner wall 226 and the oblique wall 222a functions as the inlet 227.

A plurality of holes 223 are formed in the inner wall 226 in a circular fashion. Each of the holes 223 is shaped like a slit. The holes 223 functions as exhaust holes. That is, gases introduced into the inner collecting vessel 220 are discharged to the outside of the container 20 through the exhaust holes 223 and a space under the spin head 40. A discharge pipe 225 is coupled to the bottom wall 224. A used process liquid collected into the inner collecting vessel 220 is discharged to an outer recycle system through the discharge pipe 225.

The guide wall 228 includes an oblique wall 228a and a vertical wall 228b. The oblique wall 228a is sloped down from a top end portion of the inner wall 226 in a direction away from the spin head 40. The vertical wall 228b extends vertically downwardly from a lower end portion of the oblique wall 228a. A lower end of the vertical wall 228b is spaced a predetermined distance from the bottom wall 224. A process liquid introduced through the inlet 227 is smoothly guided by the guide wall 228 toward a space 229 enclosed by the outer wall 222, the bottom wall 224, and the inner wall 226.

The middle collecting vessel 240 includes an outer wall 242, a bottom wall 244, an inner wall 246, and a protruded wall 248. The outer wall 242, the bottom wall 244, and the inner wall 246 of the middle collecting vessel 240 have structures similar to those of the outer wall 222, the bottom wall 224, and the inner wall 226 of the inner collecting vessel 220. However, since the middle collecting vessel 240 encloses the inner collecting vessel 220, the outer wall 242, the bottom wall 244, and the inner wall 246 of the middle collecting vessel 240 are larger than the outer wall 222, the bottom wall 224, and the inner wall 226 of the inner collecting vessel 220. The outer wall 242 of the middle collecting vessel 240 includes an oblique wall 242a. A top end of the oblique wall 242a is vertically spaced a predetermined distance from the top end of the oblique wall 222a of the outer wall 222 of the inner collecting vessel 220 so as to form the inlet 247 of the middle collecting vessel 240. The protruded wall 248 extends vertically downwardly from a lower edge of the bottom wall 244. A top end of the inner wall 246 of the middle collecting vessel 240 extends on to a lower edge of the bottom wall 224 of the inner collecting vessel 220. Slit-shaped exhaust holes 243 are formed in the inner wall 246 of the middle collecting vessel 240 in a ring fashion for discharging gas. A discharge pipe 245 is coupled to the bottom wall 244. A used process liquid collected into the middle collecting vessel 240 is discharged to an outer recycle system through the discharge pipe 245.

The outer collecting vessel 260 includes an outer wall 262 and a bottom wall 264. The outer wall 262 of the outer collecting vessel 260 has a structure similar to that of the outer wall 242 of the middle collecting vessel 240. However, since the outer collecting vessel 260 encloses the middle collecting vessel 240, the outer wall 262 of the outer collecting vessel 260 are larger than the outer wall 242 of the middle collecting vessel 240. The outer wall 262 of the outer collecting vessel 260 includes an oblique wall 262a. A top end of the oblique wall 262a is vertically spaced a predetermined distance from the top end of the oblique wall 242a of the outer wall 242 of the middle collecting vessel 240 so as to form the inlet 267 of the outer collecting vessel 260. The bottom wall 264 is shaped like a circular disk and includes an opening for receiving the rotation shaft 42. A discharge pipe 265 is coupled to the bottom wall 264. A used process liquid collected into the outer collecting vessel 260 is discharged to an outer recycle system through the discharge pipe 265. The outer collecting vessel 260 forms the exterior of the container 20. An exhaust pipe 263 is coupled to the bottom wall 264 of the outer collecting vessel 260. Gas introduced into the outer collecting vessel 260 is discharged through the exhaust pipe 263. In addition, gases discharged through the exhaust holes 223 and 243 of the inner walls 226 and 246 of the inner and middle collecting vessels 220 and 240 is discharged to the outside of the container 20 through the exhaust pipe 263 connected to the outer collecting vessel 260. The exhaust pipe 263 protrudes upward from the bottom wall 264 by a predetermined length.

The lifting unit 30 moves the container 20 straight and vertically. As the container 20 moves vertically, the height of the container 20 varies relative to the height of the spin head 40. The lifting unit 30 includes a bracket 31, a movable shaft 34, and a driving unit 36. The bracket 31 is fixed to an outer wall of the container 20, and the movable shaft 34 is fixed to the bracket 31. The driving unit 36 moves the movable shaft 34 vertically. When a substrate (W) is placed at the spin head 40 or lifted from the spin head 40, the container 20 is moved down so as to expose the spin head 40 through the top of the container 20. During a process, the height of the container 20 is adjusted so that process liquids used to process the substrate (W) can be separately collected to the collecting vessels 220, 240, and 260. Alternatively, the lifting unit 30 may move the spin head 40 vertically.

Figure 4:
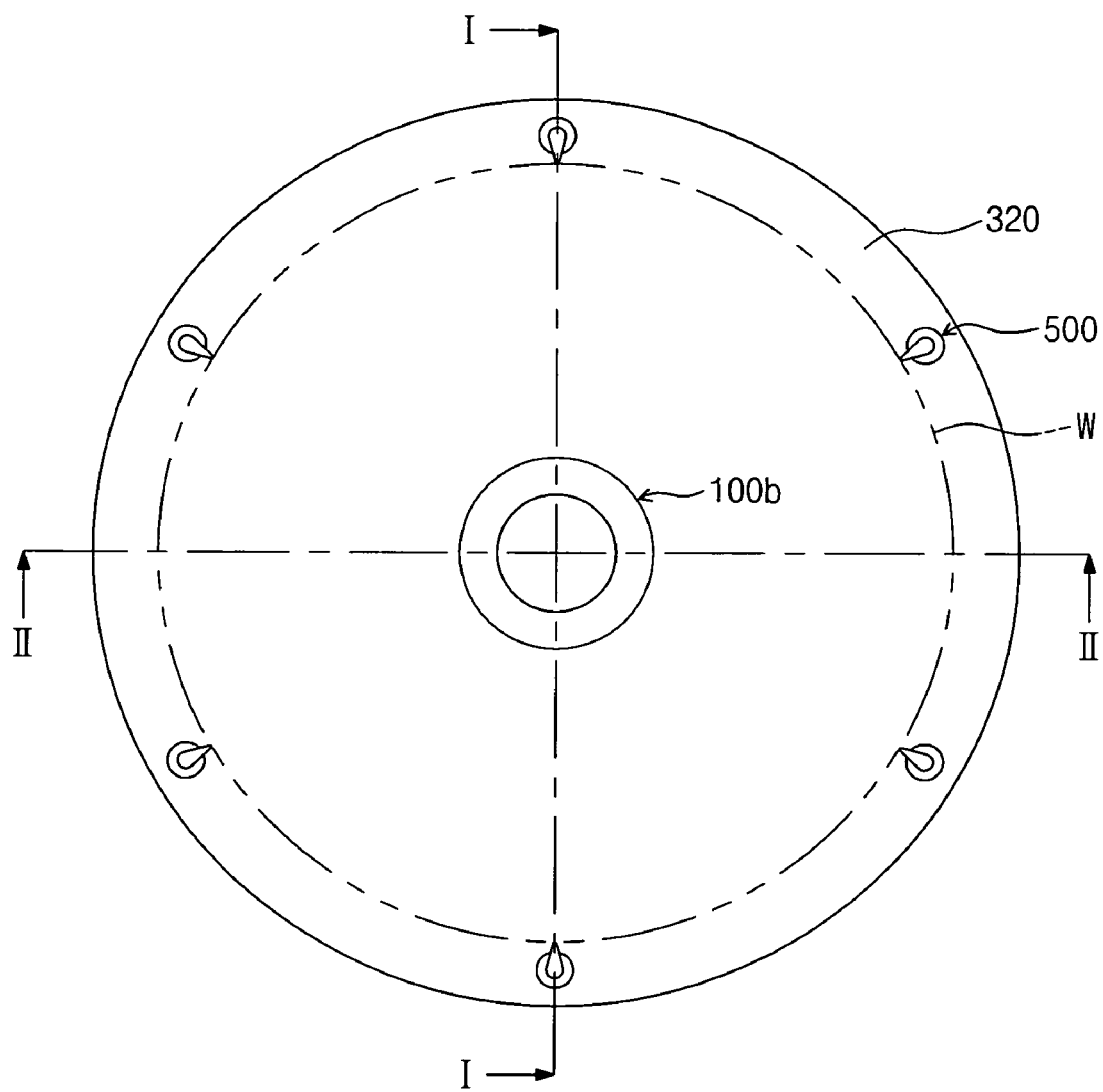
FIG. 4 is a plan view illustrating a spin head according to an embodiment of the present invention.
Figure 5:
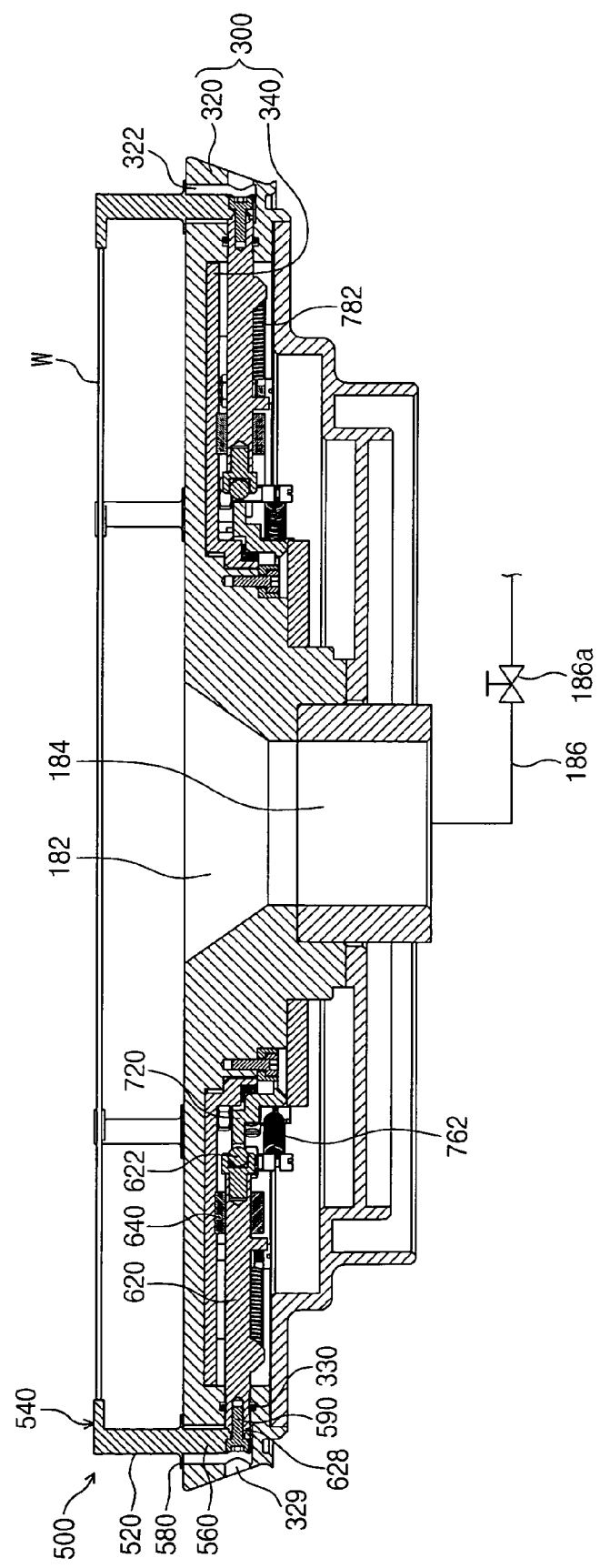
FIG. 5 is a sectional view of the spin head taken along line I-I of FIG. 4, according to an embodiment of the present invention.

An exemplary structure of the spin head 40 will now be described with reference to FIGS. 4 and 5. FIG. 4 is a plan view illustrating the spin head 40 according to an embodiment of the present invention, and FIG. 5 is a sectional view of the spin head 40 taken along line I-I of FIG. 4, according to an embodiment of the present invention. The spin head 40 includes a body 300, chuck pins 500, and a chuck pin moving unit 600 (refer to FIG. 17).

The chuck pins 500 are installed on an edge portion of the body 300 in a manner such that the chuck pins 500 protrude upward from the top surface of the body 300. The number of chuck pins 500 may be about six. The chuck pins 500 support the edge of a substrate (W) placed at the spin head 40 so that the substrate (W) can be kept in place without being detached from the spin head 40 when the spin head 40 is rotated. The chuck pins 500 have the same shape and size.

Figure 6:
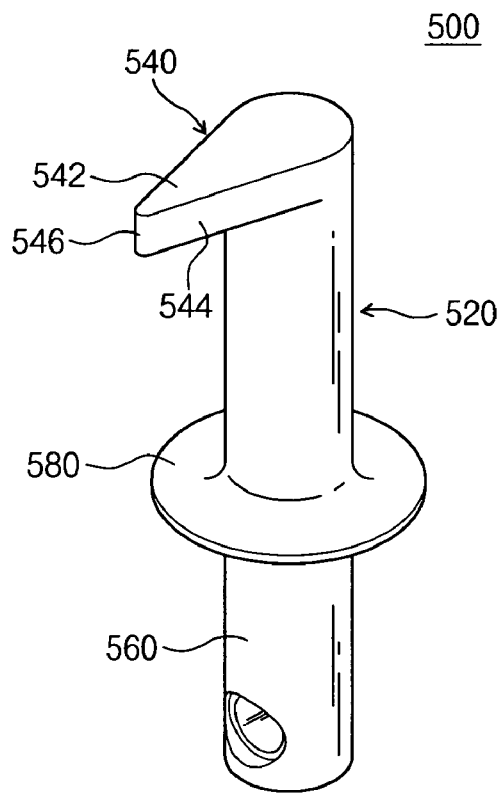
FIG. 6 is a perspective view illustrating a chuck pin according to an embodiment of the present invention.

FIG. 6 is a perspective view illustrating the chuck pin 500 according to an embodiment of the present invention. The chuck pin 500 includes a vertical rod 520, a support rod 540, a coupling portion 560, and a stopper portion 580. When the chuck pin 500 is installed at the body 300, the vertical rod 520 may be vertically positioned. The vertical rod 520 has a circular cross section perpendicular to its length. When a substrate (W) placed at the spin head 40 is rotated, the vertical rod 520 is spaced apart from the edge of the substrate (W). The support rod 540 extends from a side of the vertical rod 520. The support rod 540 extends from an end of the vertical rod 520 substantially in a horizontal direction. A distance between the support rod 540 and the body 300 is uniform from an end to the other end of the support rod 540. The support rod 540 has substantially the same height as the height of a substrate (W) placed at the body 300. When the substrate (W) placed at the body 300 is rotated, the end of the support rod 540 is in contact with the edge of the substrate (W).

Figure 7:
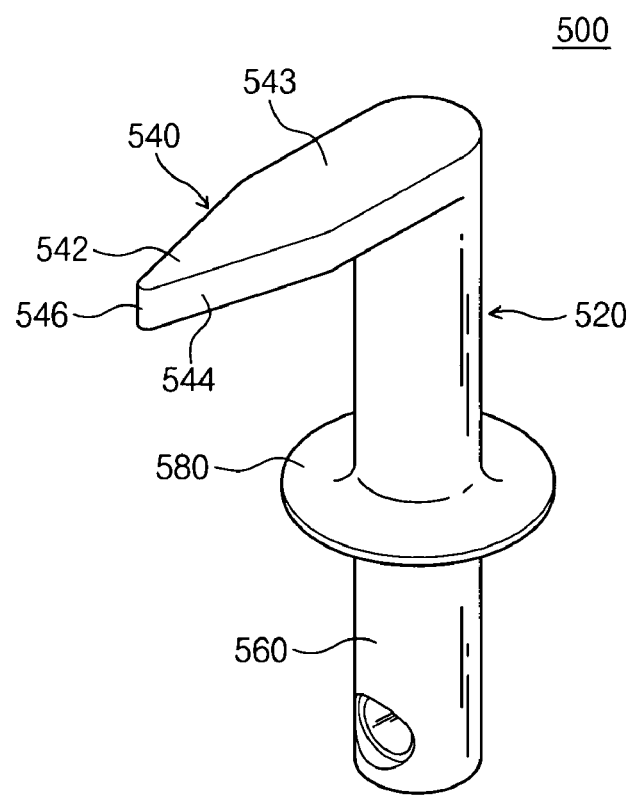
FIG. 7 is a perspective view illustrating a modified version of the chuck pin of FIG. 6, according to another embodiment of the present invention.

The support rod 540 includes a contact portion 542. The contact portion 542 extends to the end of the support rod 540. When viewed from the top, the contact portion 542 is tapered. The contact portion 542 includes symmetric side surfaces 544. The side surfaces 544 of the contact portion 542 are rounded. The side surfaces 544 of the contact portion 542 may be streamlined. The contact portion 542 has a width smaller than the diameter of the vertical rod 520. The contact portion 542 includes a distal end 546 for making contact with a substrate (W) placed at the body 300. When viewed from the top, the distal end 546 of the contact portion 542 may look like a point. The contact portion 542 may extend directly from the vertical rod 520. Alternatively, as shown in FIG. 7, a middle portion 543 having a constant width may be provided between the contact portion 542 and the vertical rod 520.

The coupling portion 560 extends downward from the vertical rod 520. The coupling portion 560 includes a screw hole for coupling with the chuck pin moving unit 600. The stopper portion 580 extends outward from the vertical rod 520 and is shaped like a ring. When the chuck pins 500 are coupled to the body 300, the stoppers 580 of the chuck pins 500 make contact with a top surface of the body 300 such that the chuck pins 500 can have the same protruded height.

Figure 8:
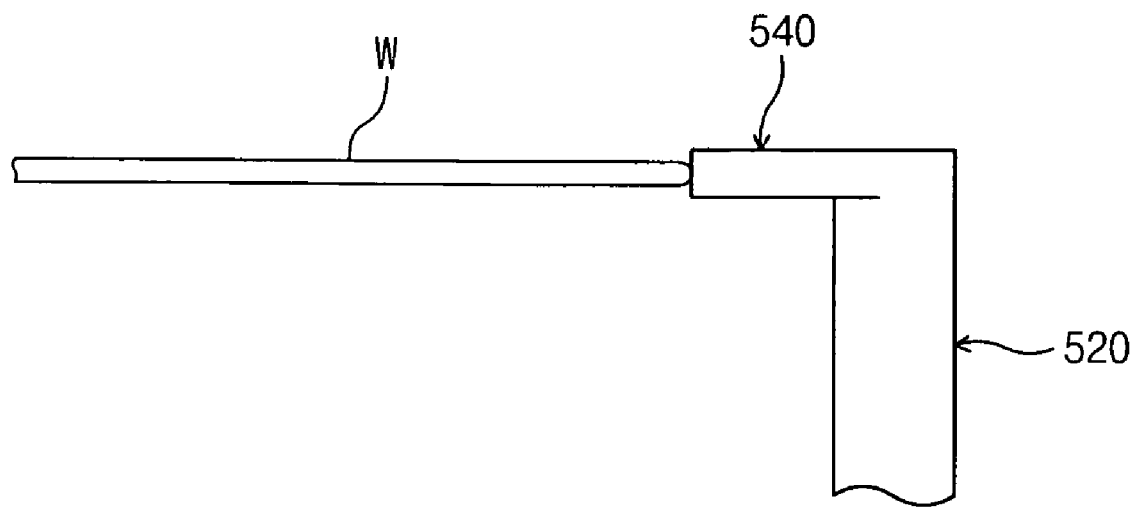
FIG. 8 is a view illustrating how the chuck pin of FIG. 6 supports the edge of a substrate according to an embodiment of the present invention.
Figure 9:
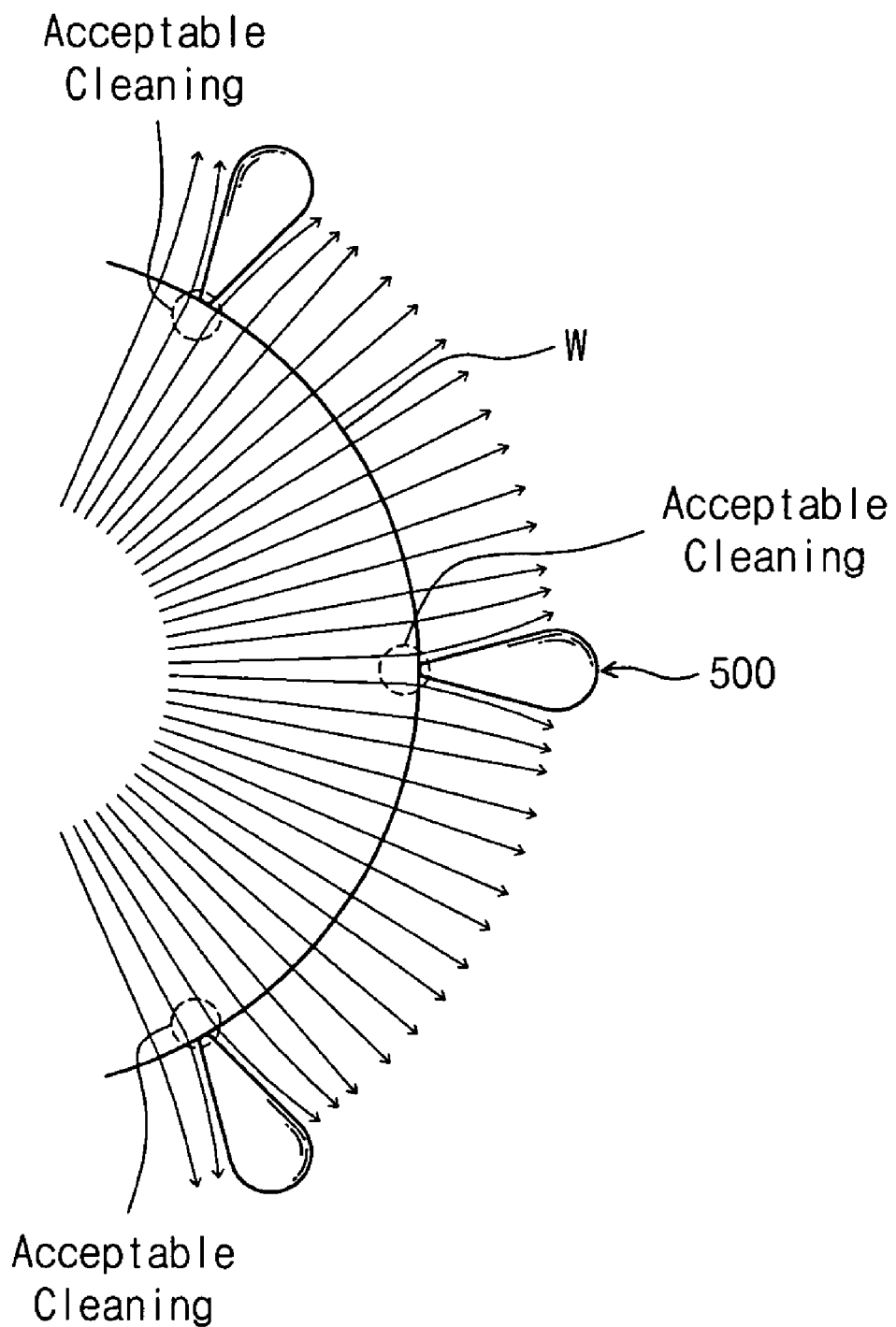
FIG. 9 is a view illustrating streams flowing on a rotating substrate according to an embodiment of the present invention.

FIG. 8 is a view illustrating how the chuck pin 500 supports an edge portion of a substrate (W) during processing according to an embodiment of the present invention, and FIG. 9 is a plan view illustrating streams of a process liquid when the spin head 40 rotates according to an embodiment of the present invention. Referring to FIG. 8, the vertical rod 520 having a relatively large cross section is spaced a predetermined distance from the substrate (W). An edge portion of the substrate (W) is supported by the contact portion 542, which is relatively narrower than the vertical rod 520 when viewed from the top and has streamlined side surfaces 544. Therefore, when the substrate (W) is rotated, a process liquid flows to the distal end 546 of the contact portion 542 and then along the side surfaces 544 of the contact portion 542. Since the process liquid can flow to a contact region between the substrate (W) and the support rod 540, the possibility of occurrence of process defects on the contact region can be reduced.

Figure 10:
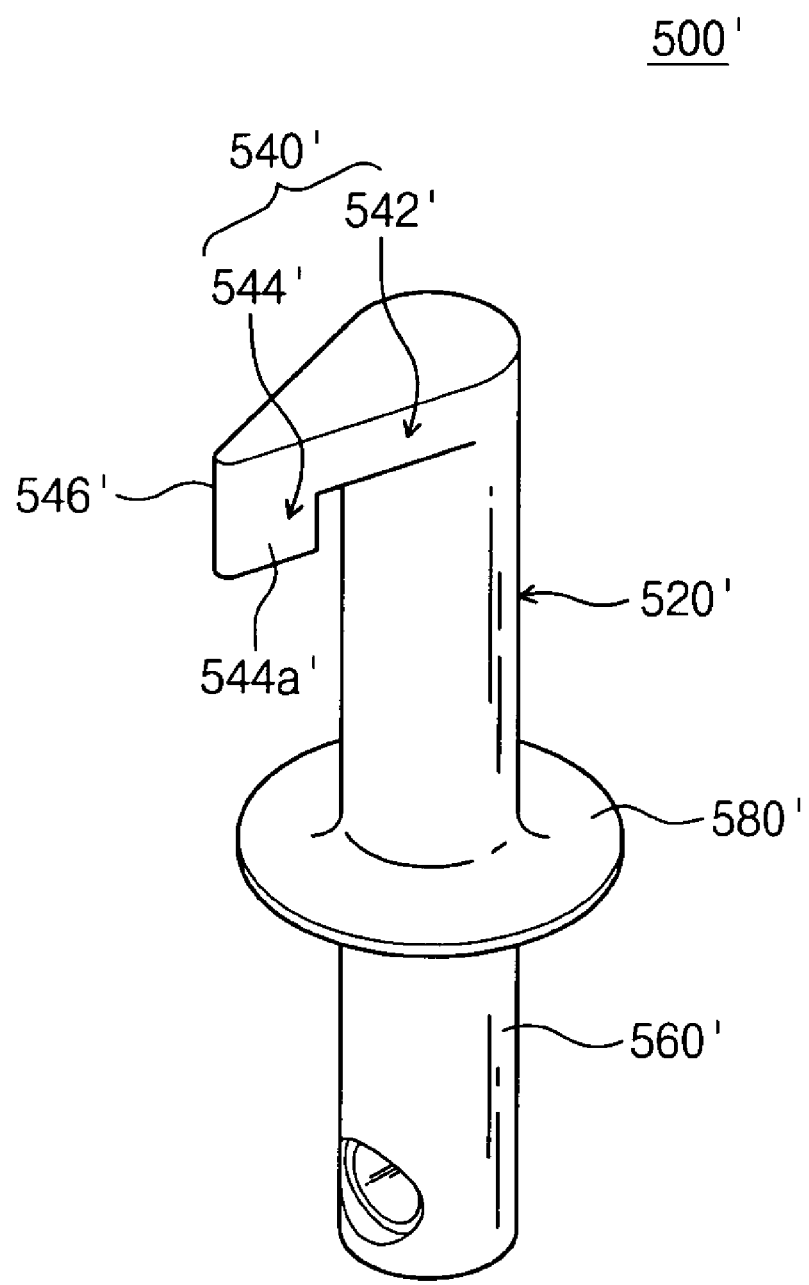
FIG. 10 is a perspective view illustrating a chuck pin according to another embodiment of the present invention.

FIG. 10 is a perspective view illustrating a chuck pin 500' according to another embodiment of the present invention. Referring to FIG. 10, the chuck pin 500' includes a vertical rod 520', a support rod 540', a coupling portion 560', and a stopper portion 580'. The vertical rod 520', the coupling portion 560', and the stopper portion 580' of the chuck pin 500' have substantially the same structures as the vertical rod 520, the coupling portion 560, and the stopper portion 580 of the chuck pin 500 of FIG. 6. Thus, detailed descriptions thereof will be omitted. The support rod 540' includes a horizontal rod 542' and a contact rod 544'. The horizontal rod 542' extends horizontally from the vertical rod 520. The contact rod 544' protrudes downward from an end of the horizontal rod 542' by a predetermined length. The contact rod 544' extends downward to or below a height where a substrate (W) is placed. During processing, the horizontal rod 542' is located higher than the substrate (W), and the contact rod 544' is located at a predetermined height so that a distal end 546' of the contact rod 544' can make contact with an edge portion of the substrate (W).

When viewed from the top, the contact rod 544' is gradually tapered away from the vertical rod 520'. The distal end 546' of the contact rod 544' is viewed as a point when viewed from the top. The contact rod 544' includes side surfaces

544a'. The side surfaces 544a' of the contact rod 544' are rounded. The side surfaces 544a' of the contact rod 544' may be streamlined. The cross-sectional area of the contact rod 544' is constant in a length direction of the contact rod 544'. When viewed from the top, the width of the contact rod 544' is smaller than the diameter of the vertical rod 520'. That is, the width of the cross section of the contact rod 544' is smaller than the diameter of the cross section of the vertical rod 520'.

Figure 11:
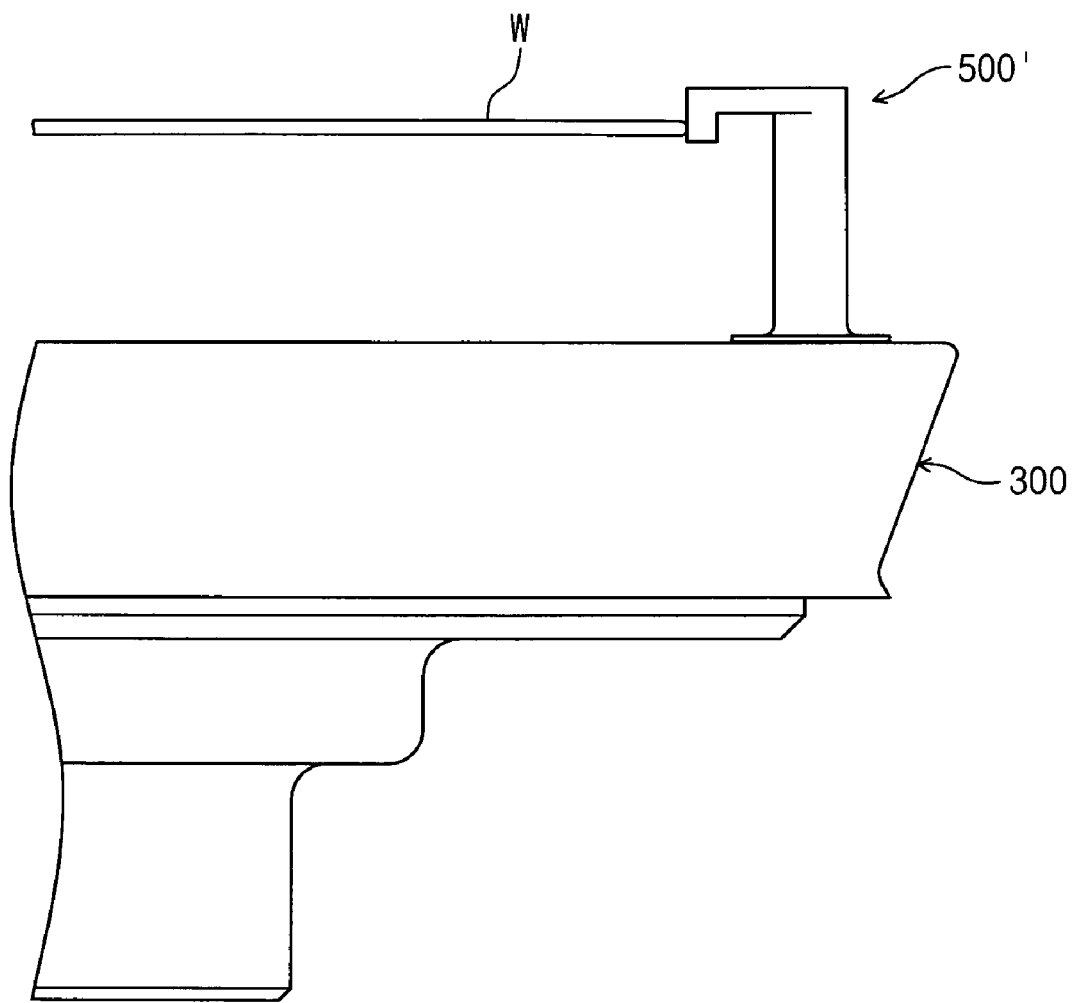
FIG. 11 is a view illustrating how the chuck pin of FIG. 10 supports the edge of a substrate according to an embodiment of the present invention.

FIG. 11 illustrates how the contact rod 544' of FIG. 10 supports an edge portion of a substrate (W) when the substrate (W) is rotated according to an embodiment of the present invention. The vertical rod 520' is spaced a predetermined distance from the substrate (W), and the horizontal rod 542' is located higher than the substrate (W). Therefore, the vertical rod 520' and the horizontal rod 542' do not impede streams generated by rotation of the substrate (W). In addition, the contact rod 544' that makes contact with the edge portion of the substrate (W) is narrow and has the streamlined side surfaces 544a'. Therefore, when viewed from the top of the substrate (W), a process liquid can reach the distal end 546' of the contact rod 544'. That is, a process liquid can be supplied to a contact region between the substrate (W) and the chuck pin 500'.

Figure 13:
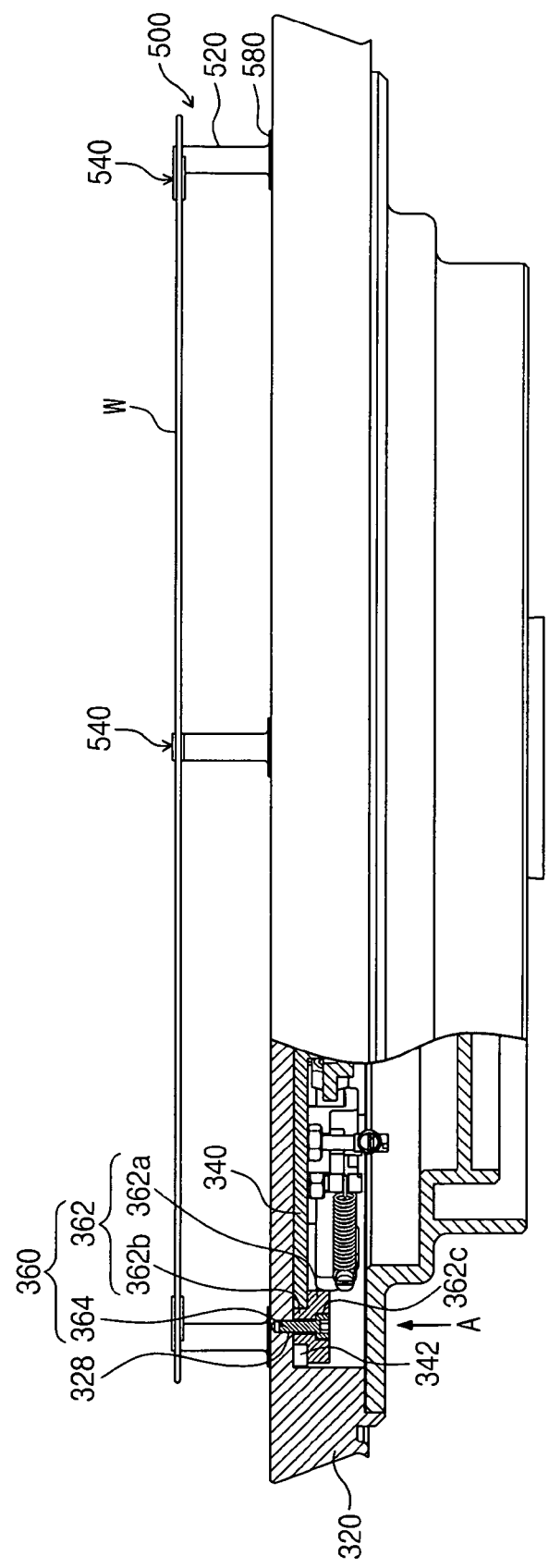
FIG. 13 is a sectional view of the spin head taken along line II-II of FIG. 4, according to an embodiment of the present invention.

Referring again to FIG. 5, the body 300 includes an upper plate 320, a lower plate 340, and pressing parts 360 (refer to FIG. 13). When viewed from the top, the upper plate 320 has a circular top surface. The lower plate 340 is disposed under the upper plate 320 and provides a room for the chuck pin moving unit 600. Pinholes 322 are formed in an edge portion of the upper plate 320 for receiving the chuck pins 500. Each of the pinholes 322 is shaped like a slit. The pinhole 322 is formed in a radial direction of the upper plate 320. The pin hole 322 has a width equal to or slightly larger than the diameter of the vertical rod 520 of the chuck pin 500. The pinhole 322 has a length in the radial direction of the upper plate 320 for guiding movement of the chuck pin 500 in the radial direction of the upper plate 320. The length of the pinhole 322 may be smaller than the diameter of the stopper portion 580 of the chuck pin 500. Alternatively, the pinhole 322 may have a circular shape. In this case, the diameter of the pinhole 322 may be greater than the diameter of the vertical rod 520 of the chuck pin 500 but smaller than the diameter of the stopper portion 580 of the chuck pin 500.

The lower nozzle member 100b (refer to FIG. 1) is disposed in the body 300. The lower nozzle member 100b includes an injection portion 182, a passage portion 184, and a gas supply conduit 186. The injection portion 182 and the passage portion 184 are disposed in a center region of the body 300 and are vertically aligned with each other. The passage portion 184 is disposed in the center portion of the body 300 and has a constant cross section in its length direction. The passage portion 184 may have a circular cross section. The injection portion 182 extends upward from the passage portion 184. A lower end of the injection portion 182 has the same cross sectional shape as the cross section shape of the passage portion 184, and the injection portion 182 widens as it goes upward. For example, the injection portion 182 may have a reverse conical shape. The gas supply conduit 186 is connected to a lower end of the passage portion 184 for supplying gas to the passage portion 184. A valve 186a is installed in the gas supply conduit 186 for opening and closing the gas supply conduit 186 or controlling the amount of gas flowing through the gas supply conduit 186.

Figure 12:
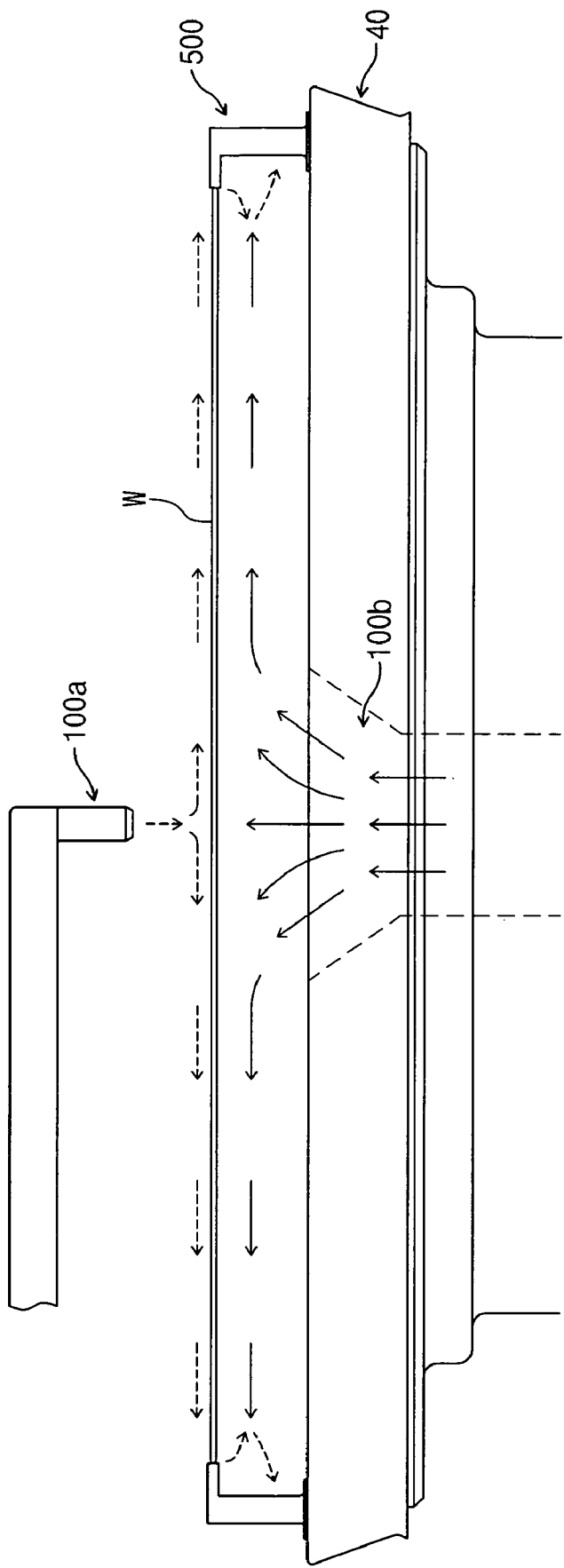
FIG. 12 is a view illustrating a substrate supported by a body, streams of a process liquid supplied through an upper nozzle member, and streams of gas supplied through a lower nozzle member according to an embodiment of the present invention.

FIG. 12 is a view illustrating a substrate (W) supported by the body 300, streams of a process liquid supplied through the upper nozzle member 100a, and streams of gas supplied through the lower nozzle member 100b according to an embodiment of the present invention. In FIG. 12, solid-line arrows represent streams of gas supplied through the lower nozzle member 100b, and dashed-line arrows represent streams of a process liquid supplied through the upper nozzle member 100a. Since gas is supplied through the lower nozzle member 100b, the substrate (W) can be stably supported at a predetermined distance apart from the body 300 by the pressure of the supplied gas. The entire top surface of the substrate (W) is treated by the process liquid supplied from the upper nozzle member 100a to the top surface of the substrate (W), and only a predetermined edge region of the bottom surface of the substrate (W) is treated by the process liquid supplied from the upper nozzle member 100a since the gas supplied from the lower nozzle member 100b restricts flows of the process liquid on the bottom surface of the substrate (W). If the substrate (W) is supported by support pins, flows of the gas may be disturbed by the support pins. Therefore, the process liquid can flow past the predetermined edge region of the substrate (W) toward an inner region of the bottom surface of the substrate (W) through regions around the support pins. However, according to the present invention, structures such as support pins are not disposed between a substrate (W) and the body 300, only a desired region of the bottom surface of the substrate (W) can be uniformly treated by a process liquid.

Figure 14:
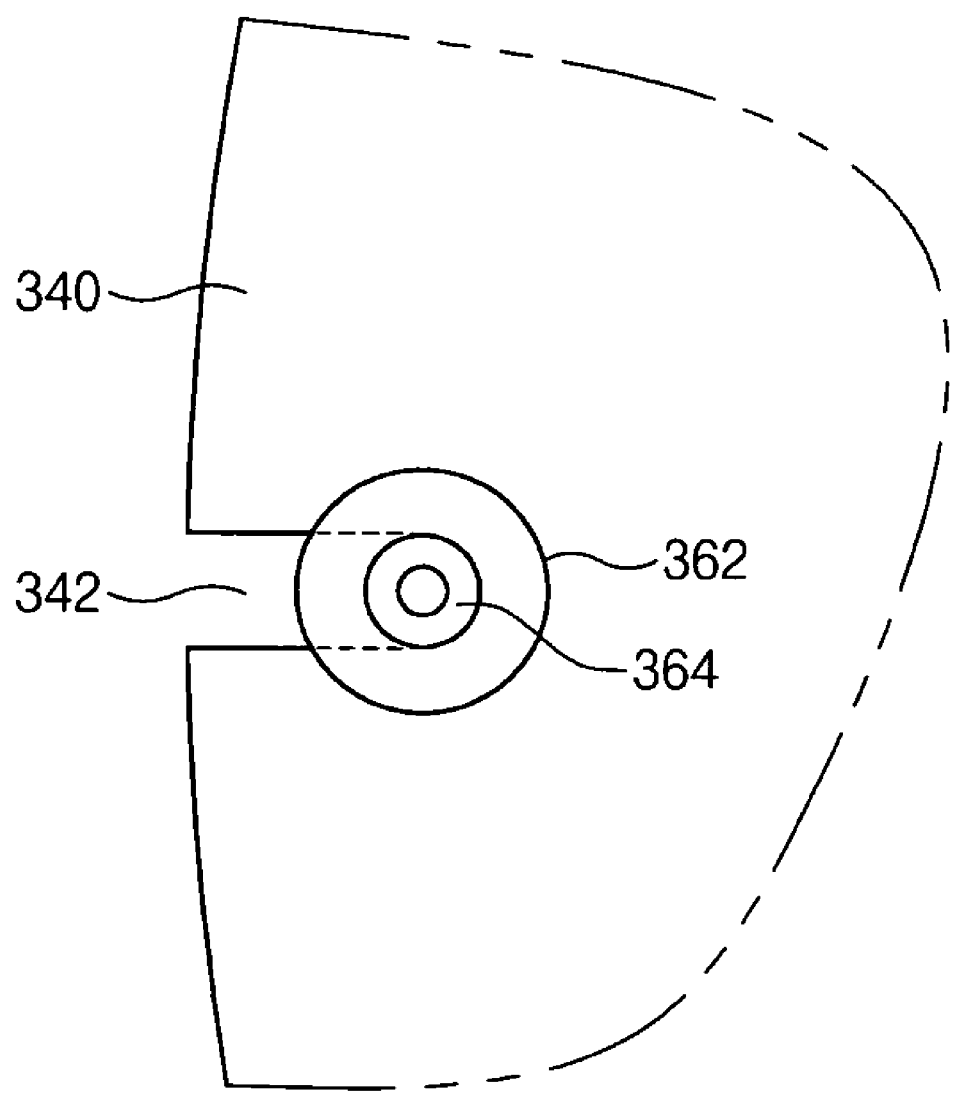
FIG. 14 is a partial view illustrating a lower plate in the direction of arrow A in FIG. 6, according to an embodiment of the present invention.

FIGS. 13 and 14 are views for illustrating an exemplary coupling structure of the upper plate 320 and the lower plate 340. FIG. 13 is a sectional view of the spin head 40 taken along line II-II of FIG. 4, according to an embodiment of the present invention, and FIG. 14 is a bottom view illustrating the lower plate 340 in the direction of arrow A in FIG. 13, according to an embodiment of the present invention. Referring to FIGS. 13 and 14, since the upper plate 320 is exposed to chemicals during a process, the upper plate 320 is formed of a material resistive to chemicals. The lower plate 340 is formed of a heat resistant material so as to prevent the chuck pins 500 from being moved from set positions due to thermal deformation of the lower plate 340 when a hot chemical is applied to a substrate (W) placed at the spin head 40. That is, the upper plate 320 is formed of a material having better corrosion resistant characteristics than the lower plate 340, and the lower plate 340 is formed of a material that is less deformed by heat than the upper plate 320. For example, the upper plate 320 may be formed of polyvinylchloride, and the lower plate 340 may be formed of aluminum. The upper plate 320 and the lower plate 340 are coupled using the pressing parts 360. Threaded grooves 328 are formed in a bottom surface of the upper plate 320, and slit grooves 342 are formed in the lower plate 340 in radial directions of the body 300 in correspondence with the threaded grooves 328.

The pressing parts 360 are coupled to the upper plate 320 through the slit grooves 342 in a direction from the lower plate 340 to the upper plate 320. Each of the pressing parts 360 includes a pressing plate 362 and a screw 364. A hole 362c is formed vertically through a center portion of the pressing plate 362. The screw 364 is inserted through the hole 362c of the pressing plate 362, the slit groove 342 of the lower plate 340, and the threaded groove 328 of the upper plate 320 in a direction from the lower plate 340 to the upper plate 320 so as to couple the upper plate 320 and the lower plate 340. The pressing plate 362 includes insertion portion 362b and a head portion 362a. The insertion portion 362b is inserted in the slit groove 342 of the lower plate 340, and the head portion 362a extends downward from the insertion portion 362b for pressing the lower plate 340. The insertion portion 362b of the pressing plate 362 has a diameter approximately equal to the width of the slit groove 342 of the lower plate 340, the head portion 362a of the pressing plate 362 has a diameter greater than the width of the slit groove 342.

Figure 15:
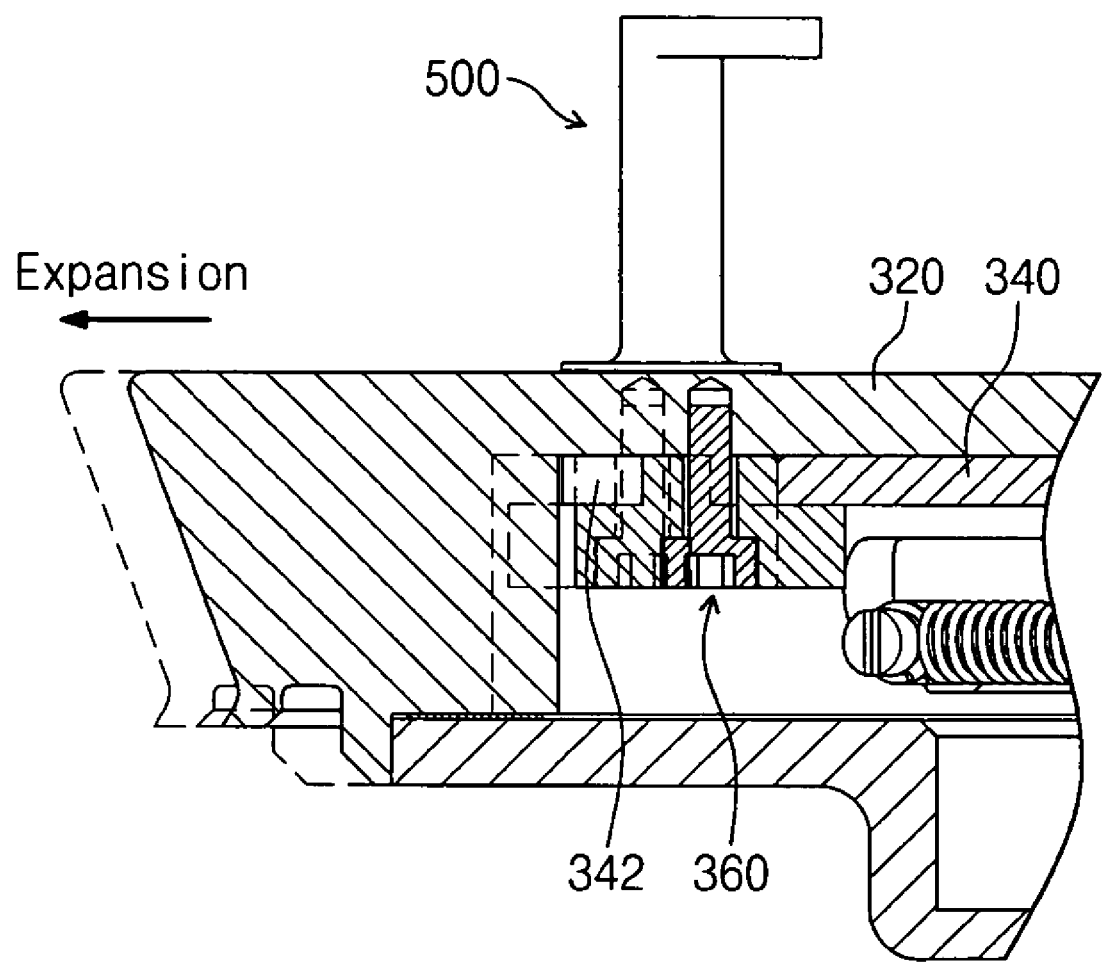
FIG. 15 is a view for illustrating a relationship between the lower plate and an upper plate when the upper plate expands, according to an embodiment of the present invention.

FIG. 15 is a view for explaining advantageous effects when the upper plate 320 and the lower plate 340 are used according to an embodiment of the present invention. In FIG. 15, the upper plate 320 is indicated by solid lines before the upper plate 320 undergoes thermal expansion and is indicated by dashed lines after the upper plate 320 undergoes thermal expansion. Referring to FIG. 15, although the upper plate 320 expands due to a hot chemical, the pressing part 360 is moved independent of the lower plate 340 along the slit groove 342. Therefore, the lower plate 340 is not deformed by the thermal expansion of the upper plate 320. Since various components are coupled to the lower plate 340 for positioning the chuck pins 500, the chuck pins 500 can be prevented from being moved from set positions by preventing deformation of the lower plate 340 as described above.

The chuck pin moving unit 600 moves the chuck pins 500 between supporting positions and rest positions. In the supporting positions, the chuck pins 500 are in contact with the edge of a substrate (W) placed at the spin head 40. In the rest positions, the chuck pins 500 are located outward from the supporting positions so as to allow a substrate (W) to be placed at the spin head 40. That is, the supporting positions are closer to a center portion of the body 300 than the rest positions.

Figure 16:
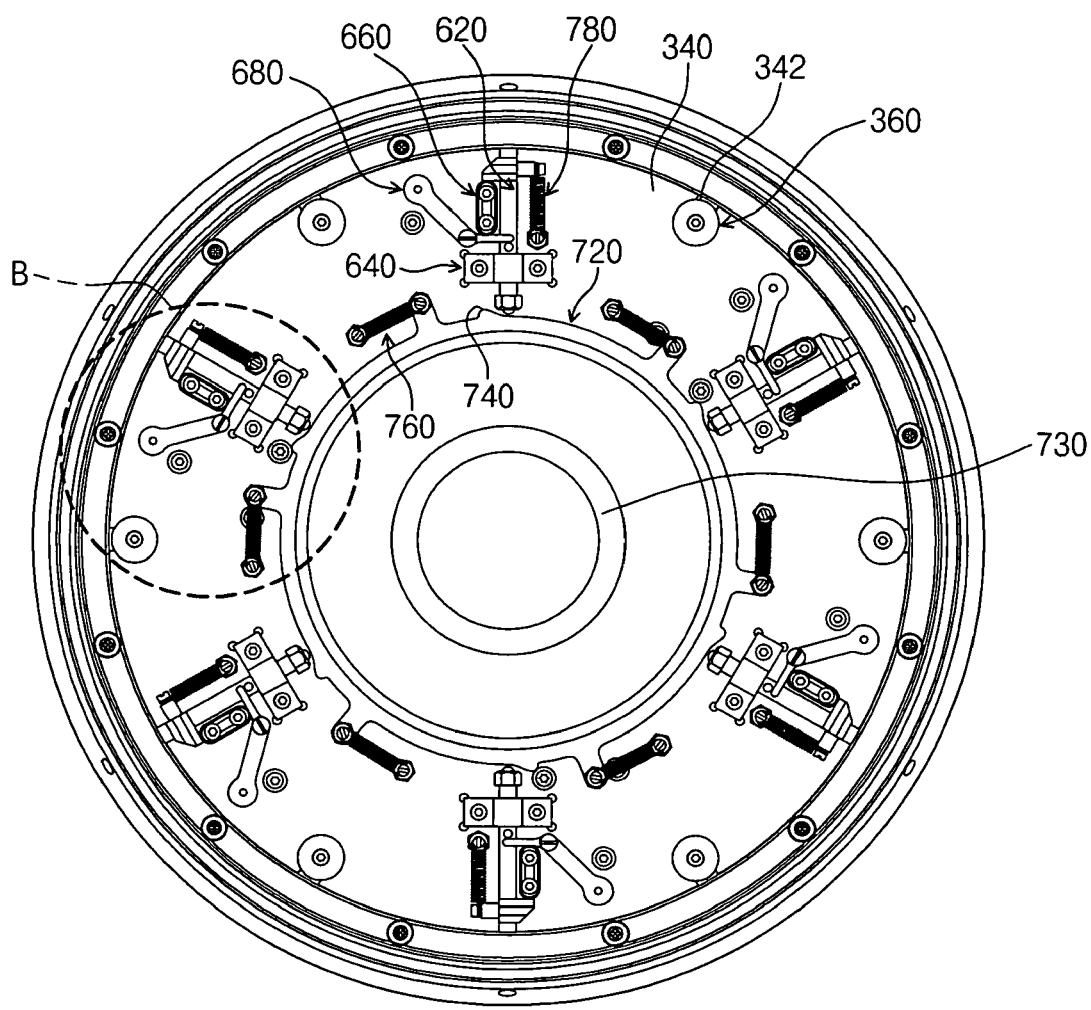
FIG. 16 is a bottom view illustrating a chuck pin moving unit disposed on the bottom of the lower plate, according to an embodiment of the present invention.
Figure 17:
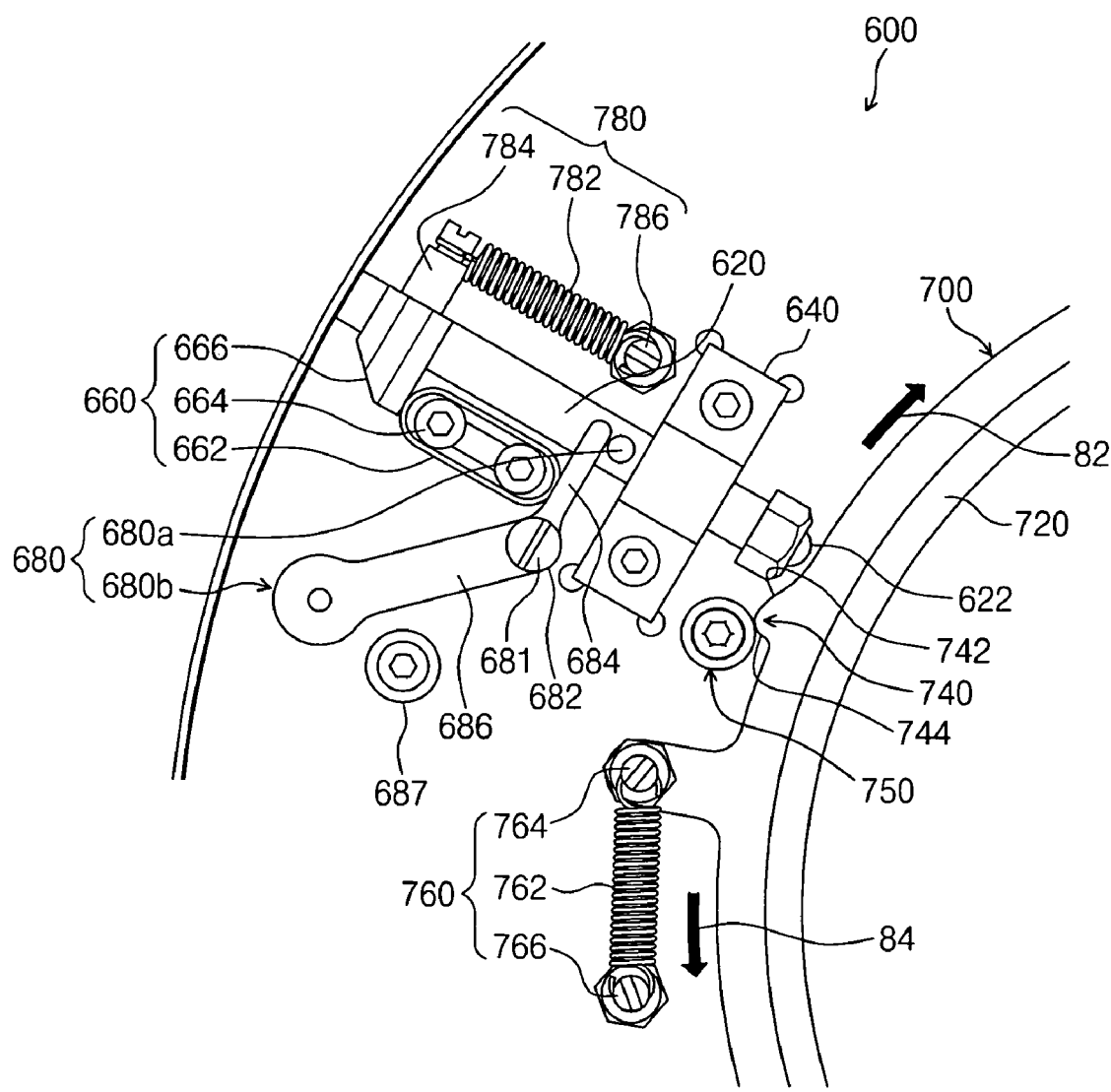
FIG. 17 is an enlarged view of portion B of FIG. 16, according to an embodiment of the present invention.

FIG. 16 is a bottom view illustrating the chuck pin moving unit 600 according to an embodiment of the present invention, and FIG. 17 is an enlarged view of portion B of FIG. 16, according to an embodiment of the present invention. The chuck pin moving unit 600 includes movable rods 620, guide members 640, distance adjustors 660, contact maintaining members 680, and a linear mover 700.

The number of the movable rods 620 is equal to the number of the chuck pins 500. The moveable rods 620 are coupled to the chuck pins 500, respectively. The movable rods 620 are disposed in the lower plate 340 in the radial directions of the body 300. The upper plate 320 includes a lateral portion protruded downward from its edge, and holes 329 (refer to FIG. 5) are formed through the lateral portion in a direction from an outer surface to an inner surface of the lateral portion. The holes 329 communicate with the pinholes 322 of the upper plate 320. An outer end of the movable rod 620 is disposed in the hole 329. A screw hole 628 (refer to FIG. 5) is formed in the movable rod 620. The movable rod 620 is fixedly coupled to the chuck pin 500 using a screw 590. A sealing member 330 is disposed in the hole 329 to enclose the movable rod 620 for sealing an inner space of the lower plate 340. The sealing member 330 may be an o-ring. The movable rod 620 includes a rolling ball 622 at an inner end thereof. The rolling ball 622 is rotatably coupled to the inner end of the movable rod 620.

The guide members 640 are disposed on moving paths of the movable rods 620, respectively. The guide members 640 guide linear movements of the movable rods 620 in the radial directions of the body 300. The guide members 640 may be sliding bearings fixed to the body 300.

The linear mover 700 moves the movable rods 620 straight in the radial directions of the body 300 between the rest positions and the supporting positions. The linear mover 700 includes a cam 720, a cam driving unit 730, cam return units 760, and chuck pin return units 780. The cam 720 is shaped like a circular ring. The cam 720 includes protrusions 740. The protrusions extend outward from the periphery of the cam 720. The number of the protrusions 740 is equal to the number of the movable rods 620, and the protrusions 740 are formed at positions corresponding to the movable rods 620.

Each of the protrusions 740 includes a gradually inclined front surface 742 and a steeply inclined rear surface 744. The cam driving unit 730 rotates the cam 720 in a first rotation direction 82, and the cam return units 760 rotate the cam 720 in a second rotation direction 84 opposite to the first rotation direction 82. A rotary cylinder may be used as the cam driving unit 730 for rotating the cam 720 a predetermined angle. The rotary cylinder may rotate a rotation shaft (not shown) fixed to the cam 720. Cam stoppers 750 are fixed to the body 300 beside the protrusions 740 for restricting rotation of the cam 720. The cam return units 760 may include springs 762 providing elastic forces for returning the cam 720. Ends of the spring 762 are fixed to first hooks 764 of the cam 720, and the other ends of the springs 762 are fixed to second hooks 766 of the lower plate 340. The first hooks 764 are closer to the protrusions 740 than the second hooks 766.

In an embodiment, the cam driving unit 730 may rotate the cam 720 so that the rolling ball 622 can rotate upward on the front surface 742 of the protrusion 740. As the cam 720 is rotated in the first rotation direction 82, the chuck pin 500 is moved from the supporting position to the rest position, and the spring 762 of the cam return unit 760 extends. If a driving force of the cam driving unit 730 is interrupted, the cam 720 is rotated in the second rotation direction 84 by a resilient force of the spring 762, and the rolling ball 622 is moved away from the front surface 742 of the protrusion 740. In the current embodiment, when the chuck pin 500 is in the supporting position, the spring 762 is in equilibrium. Therefore, although the cam driving unit 730 malfunctions, a substrate (W) can be stably supported by the chuck pin 500.

Figure 18:
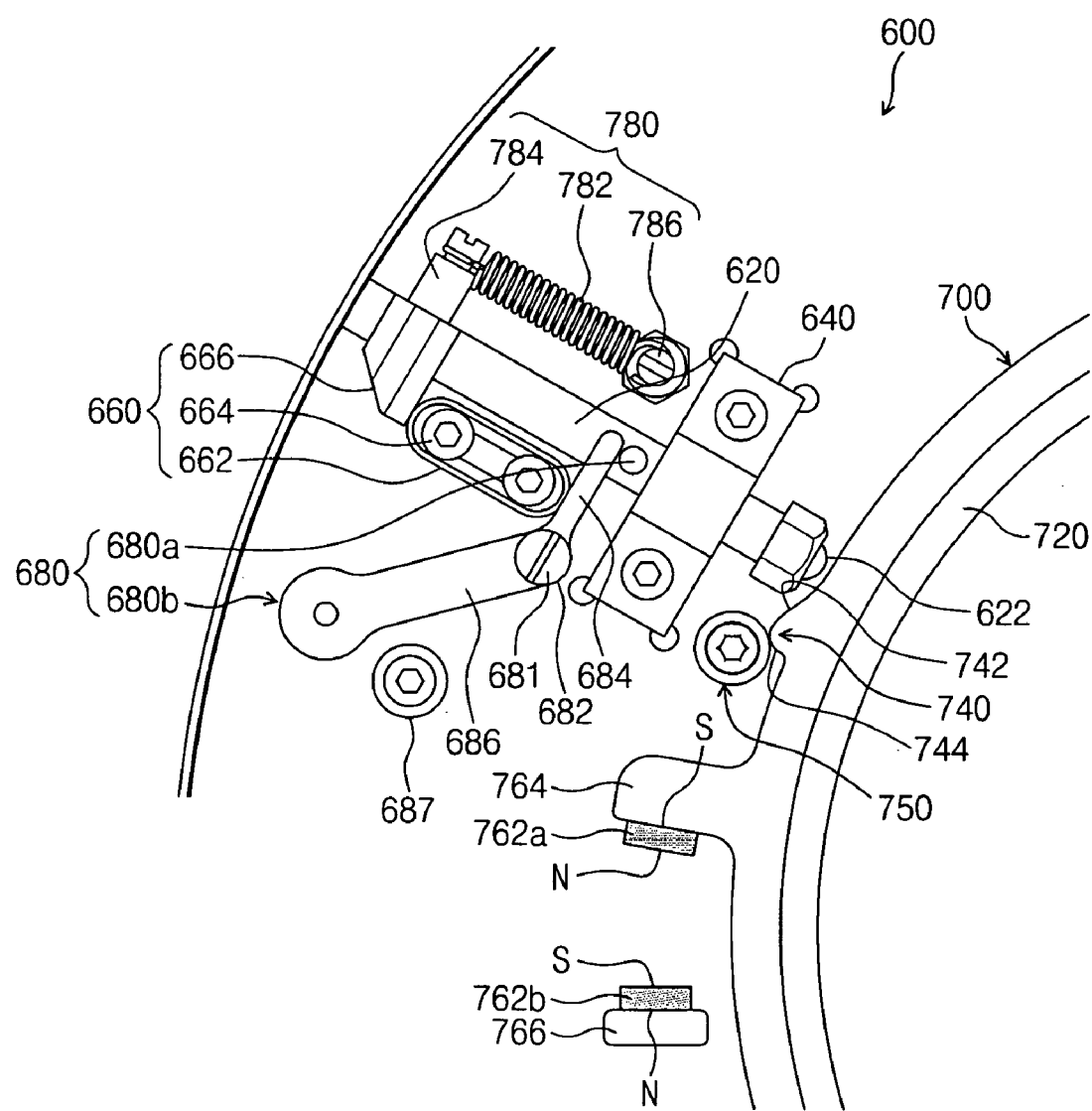
FIG. 18 is a view illustrating another example of a cam return unit of FIG. 17, according to another embodiment of the present invention.

In another embodiment, the cam 720 can be returned to its original position using a magnetic force. For this, as shown in FIG. 18, a first magnet 762a is disposed at the cam 720, and the second magnet 762b is disposed at the body 300. The first and second magnets 762a and 762b are arranged such that when a driving force applied to the cam 720 is interrupted, the chuck pin 500 can be moved from the rest position to the supporting position. For example, the first magnet 762a may be disposed between the protrusion 740 and the second magnet 762b. The first and second magnets 762a and 762b may be oriented so that opposite poles of the first and second magnets 762a and 762b can face each other.

In another embodiment, the cam driving unit 730 may rotate the cam 720 to move the chuck pin 500 from the rest position to the supporting position, and the cam return units 760 may rotate the cam 720 to move the chuck pin 500 from the supporting position to the rest position.

In another embodiment, the chuck pin 500 may be moved by the cam driving unit 730 in both directions from the rest position to the supporting position and from the supporting position to the rest position.

As explained above, when the cam 720 is rotated in the first rotation direction 82, the rolling ball 622 rotates along the front surface 742 of the protrusion 740 away from the cam 720. When the cam 720 is rotated in the second rotation direction 84, the chuck pin return units 780 moves the chuck pin 500 from the rest position to the supporting position using a resilient force. In the embodiment shown in FIG. 17, the chuck pin return unit 780 includes an elastic member such as a spring 782 for returning the chuck pin 500 using the elastic force of the spring 782. An end of the spring 782 is fixed to a first hook 784 extending from an end portion of the movable rod 620, and the other end of the spring 782 is fixed to a second hook 786 fixedly coupled to the body 300. The second hook 786 is disposed between the first hook 784 and the cam 720. Thus, when the movable rod 620 is moved away from the cam 720, the spring 782 is extended. When the cam 720 is rotated in the second rotation direction 84 by a resilient force, the movable rod 620 is moved toward the cam 720 by an elastic force of the spring 782, and thus the chuck pin 500 is moved from the rest position to the supporting position.

Figure 19:
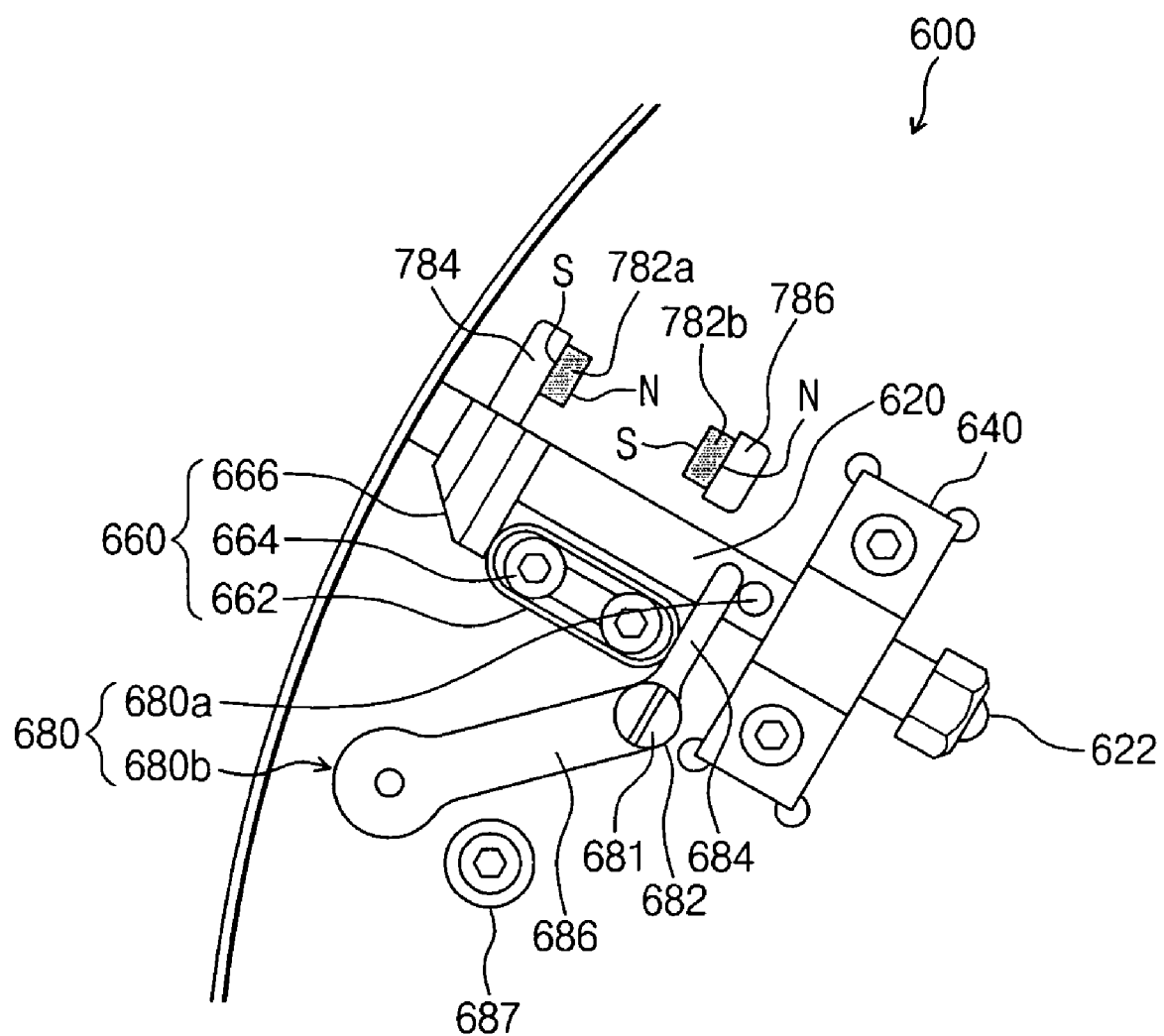
FIG. 19 is a view illustrating another example of a chum pin return unit of FIG. 17, according to another embodiment of the present invention.

In another embodiment shown in FIG. 19, the chuck pin 500 may be returned from the rest position to the supporting position by a magnetic force. For example, a first magnet 782a may be disposed at the movable rod 620, and a second magnet 782b may be disposed at the body 300. The poles of the first and second magnets 782a and 782b are matched such that the chuck pin 500 can be moved from the rest position to the supporting position by the magnetic force of the first and second magnets 782a and 782b when a driving force of the cam driving unit 730 is interrupted. When the second magnet 782b is closer to the center of the body 300 than the first magnet 782a as shown in FIG. 19, the first and second magnets 782a and 782b are oriented with opposite poles of the first and second magnets 782a and 782b facing each other. On the other hand, when the first magnet 782a is closer to the center of the body 300 than the second magnet 782b, the first and second magnets 782a and 782b are oriented with like poles of the first and second magnets 782a and 782b facing each other.

If the movable rods 620 are moved toward the center of the body 300 by a single force, the chuck pins 500 may not be individually moved. In this case, although the chuck pins 500 are moved to the supporting positions, some of the chuck pins 500 may not be in contact with the edge of a substrate (W) placed at the spin head 40 due to machining errors of components such as the chuck pins 500, the movable rods 620, and the cam 720. Therefore, when the spin head 40 is rotated, stresses may be concentrated on some of the chuck pins 500 that make contact with the edge of the substrate (W). Thus, the chuck pins 500 can be easily damaged and broken. However, in the present invention, since the chuck pin return units 780 are respectively disposed at the movable rods 620, the movable rods 620 can be moved toward the center of the body 300 by returning forces individually applied to the movable rod 620. Therefore, although components such as the chuck pins 500, the movable rods 620, and the cam 720 are not uniform in size due to machining errors, all the chuck pins 500 can be in contact with the edge of a substrate (W) when the chuck pins 500 are moved to the supporting positions.

Figure 20A:
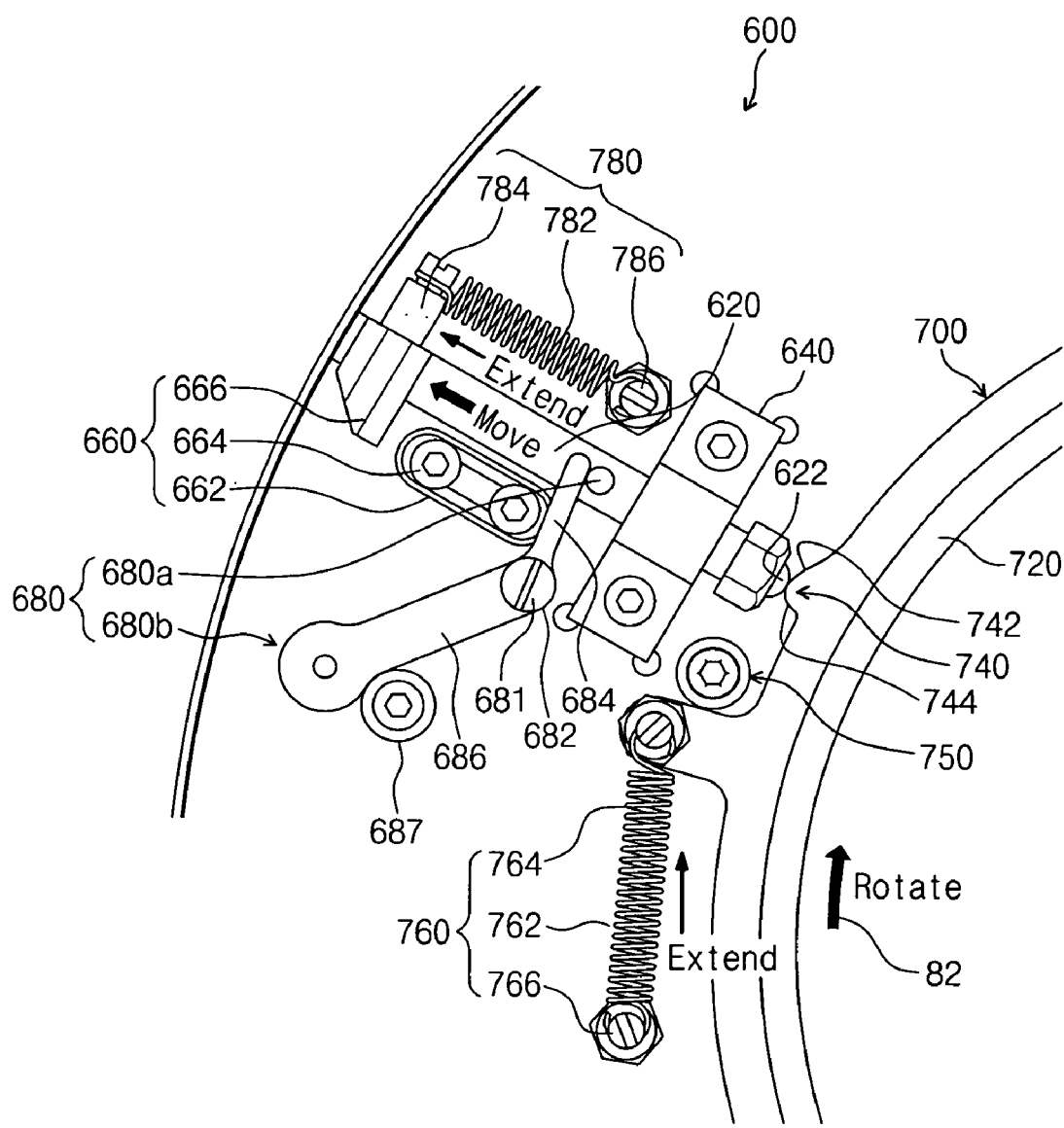
FIGS. 20A and 20B are views illustrating forces exerted by components of the chuck pin moving unit and moving directions of the components of the chuck pin moving unit when a chuck pin is shifted between a rest position and a supporting position by the chuck pin moving unit, according to an embodiment of the present invention.
Figure 20B:
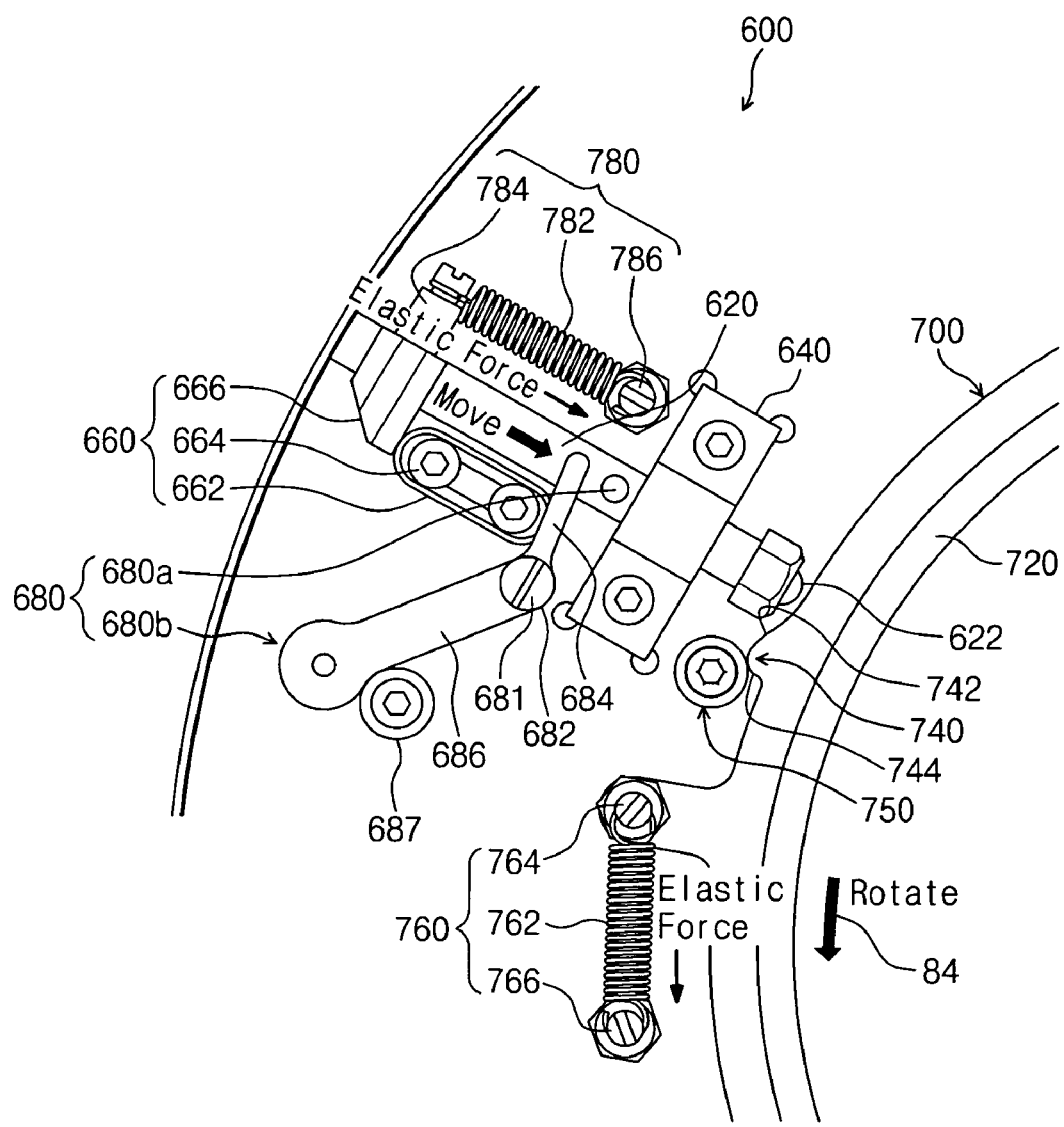

FIGS. 20A and 20B are views for explaining an exemplary relationship among the rotation direction of the cam 720, operations of the cam return unit 760 and the chuck pin return unit 780, and the moving direction of the movable rod 620 according to an embodiment of the present invention. Referring to FIG. 20A, when the cam 720 is rotated by the cam driving unit 730 in the first rotation direction 82, the spring 762 of the cam return unit 760 is extended, and the movable rod 620 is moved from the supporting position to the rest position. Thus, the spring 782 of the chuck pin return unit 780 is extended. Then, when a driving force of the cam driving unit 730 is interrupted as shown in FIG. 20B, the cam 720 is rotated in the second rotation direction 84 by an elastic force of the cam return unit 760, and the movable rod 620 is moved from the rest position to the supporting position by an elastic force of the chuck pin return unit 780.

In the above-described embodiments, the chuck pins 500 are switched between the supporting positions and the rest positions by moving the chuck pins 500 straight in radial directions of the body 300. However, alternatively, the support rods 540 of the chuck pins 500 may be switched between rest positions and supporting positions by rotating the vertical rods 520 of the chuck pins 500 using the chuck pin moving unit 600.

If the spin head 40 is rotated at high speed, the chuck pins 500 can be moved outward in radial directions of the body 300 by a centrifugal force. In this case, a substrate (W) placed at the spin head 46 may be unstably supported by the chuck pins 500. To prevent this situation, the contact maintaining member 680 holds the chuck pin 500 at the supporting position to maintain contact between the chuck pin 500 and the edge of the substrate (W) when the spin head 40 is rotated. The contact maintaining member 680 includes a fixed pin 680a and a maintaining bar 680b. The fixed pin 680a is fixed to the movable rod 620 and is protruded from the movable rod 620. When the spin head 40 is rotated, the maintaining bar 680b pushes the fixed pin 680a toward the center of the body 300.

For example, the maintaining bar 680b may be configured to push the fixed pin 680a using a centrifugal force when the spin head 40 is rotated. Referring to FIG. 16, the maintaining bar 680b includes a center portion 682, a pressing portion 684, and a guide portion 686. The center portion 682 is coupled to the body 300 using a pin 681 and is rotatable with respect to the body 300. The pressing portion 684 pushes the fixed pin 680a toward the center of the body 300 when the spin head 40 is rotated. The guide portion 686 causes the pressing portion 684 to move toward the fixed pin 680a when the spin head 40 is rotated. The pressing portion 684 extends from the center portion 682 in a predetermined direction, and the guide portion 686 extends from the center portion 682 at an obtuse angle with the pressing portion 684. The pressing portion 684 and the guide portion 686 are shaped like a rod.

When the spin head 40 rotates, the guide portion 686 receives a centrifugal force greater than a centrifugal force acting on the pressing portion 684. The guide portion 686 is heavier than the pressing portion 684. When viewed from the top, the guide portion 686 may be wider than the pressing portion 684. A free end of the guide portion 686 may be wider than the pressing portion 684.

The contact maintaining member 680 is oriented such that the pressing portion 684 is directed to the movable rod 620 and the guide portion 686 is disposed away from the movable rod 620. The pressing portion 684 is disposed opposite to the cam 720 with respect to the fixed pin 680a. The distance between the guide portion 686 and the movable rod 620 increases in a direction away from the center of the body 300.

Figure 21:
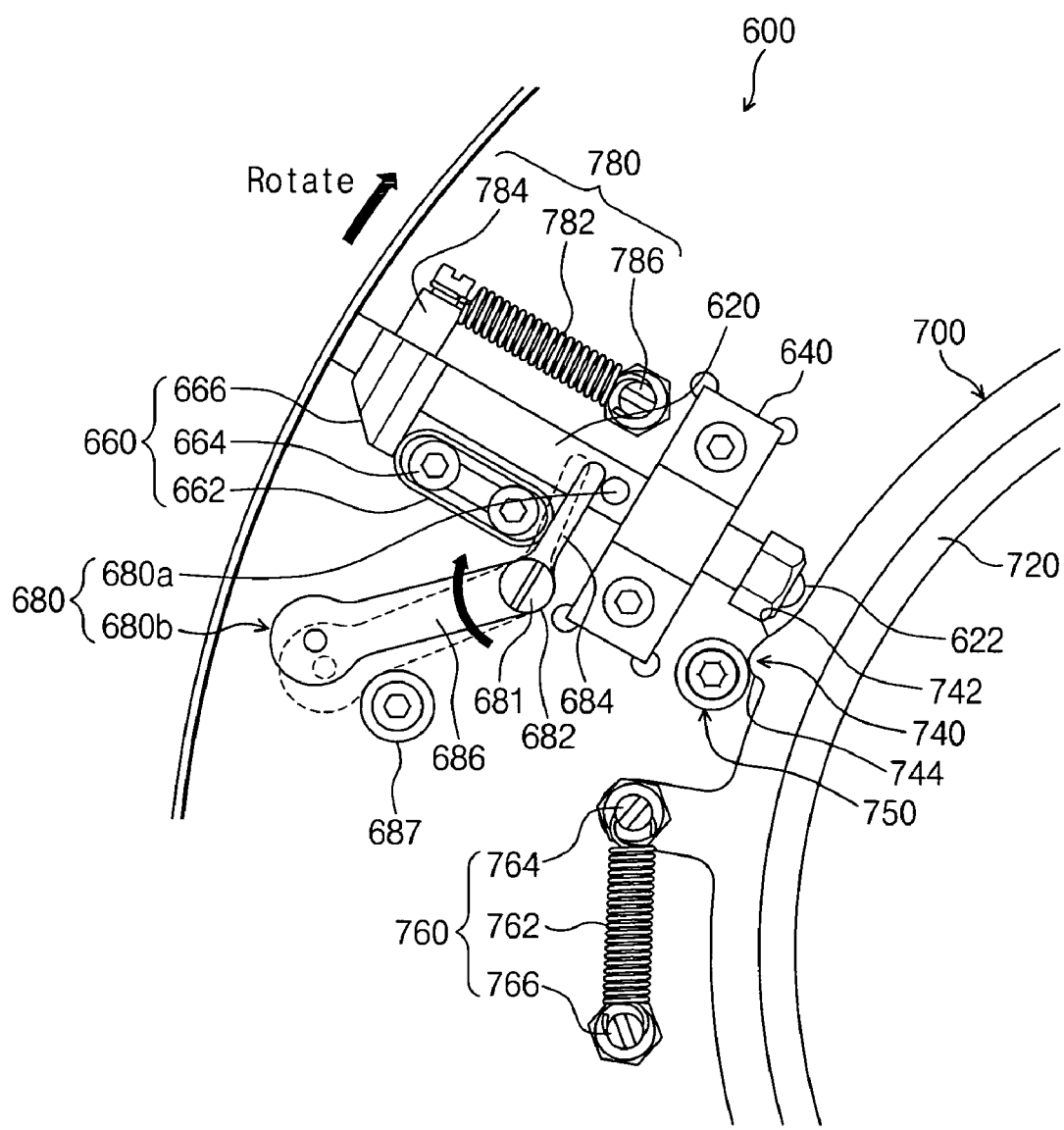
FIG. 21 is a view illustrating how a contact maintaining unit keeps the chuck pin in contact with a substrate using a centrifugal force according to an embodiment of the present invention.

FIG. 21 illustrates an exemplary operation of the contact maintaining member 680 according to an embodiment of the present invention. When the spin head 40 does not rotate, no force is applied to the pressing portion 684. When the movable rod 620 is moved away from the center of the body 300 by rotation of the cam 720, the fixed pin 680a pushes the pressing portion 684 in a direction away from the center of the body 300, and thus the pressing portion 684 is rotated not to impede the movement of the movable rod 620. Here, the guide portion 686 is not rotated more than a predetermined angle owing to a stopper 687 fixed to the body 300 at a position opposite to the movable rod 620 with respect to the guide portion 686. When the chuck pin 500 is in the supporting position and the spin head 40 is rotated, the guide portion 686 is rotated toward the movable rod 620 since a centrifugal force is applied to the guide portion 686. Since the pressing portion 684 is fixed to the guide portion 686, the pressing portion 684 rotated with the guide portion 686. That is, the pressing portion 684 is rotated toward the fixed pin 680a in a direction opposite to the direction of the centrifugal force. Thus, the fixed pin 680a can be pushed by the pressing portion 684 toward the center of the body 300. Therefore, while the spin head 40 is rotated, the chuck pin 500 can be kept in contact with the edge of a substrate (W) placed at the spin head 40.

Since the fixed pin 680a of the contact maintaining member 680 is pushed toward the center of the body 300 using a centrifugal force when the spin head 40 is rotated, an additional driving unit is unnecessary for driving the contact maintaining member 680, and thus the contact maintaining member 680 can have a simple structure. Alternatively, an additional driving unit can be used to rotate the contact maintaining member 680 so as to push the movable rod 620 toward the center of the body 300 when the spin head 40 is rotated.

The diameter of a substrate (W) can be varied due to the previous process. For example, if the substrate (W) is heat treated in the previous process, the diameter of the substrate (W) may be varied due to thermal expansion. For this, the distance adjustor 660 can be used to adjust the supporting position of the chuck pin 500. The distance adjustor 660 includes an adjustment block 662 and fixing members 664. The adjustment block 662 includes a slit shaped penetration hole. The length of the penetration hole is parallel with the moving direction of the movable rod 620. The fixing members 664 are used to fix the adjustment block 662 to the body 300. Each of the fixing members 664 includes a head portion 664a and an insertion portion 664b extending from the head portion 664a. The head portion 664a is greater than the width of the penetration hole. The insertion portion 664b is inserted through the penetration hole and is coupled to a screw groove (not shown) formed in the body 300. The head portion 664a can be pressed against the adjustment block 662 by inserting the insertion portion 664b into the body 300. In this way, the adjustment block 662 can be fixed to the body 300. The number of the fixing members 664 may be two. A stopper 666 is disposed at the movable rod 620. The adjustment block 662 is disposed between the stopper 666 and the cam 720. When the movable rod 620 is moved toward the center of the body 300 by a resilient force of the chuck pin return unit 780, the stopper 666 makes contact with an end of the adjustment block 662 so that the movement of the movable rod 620 can be restricted.

Figure 22:
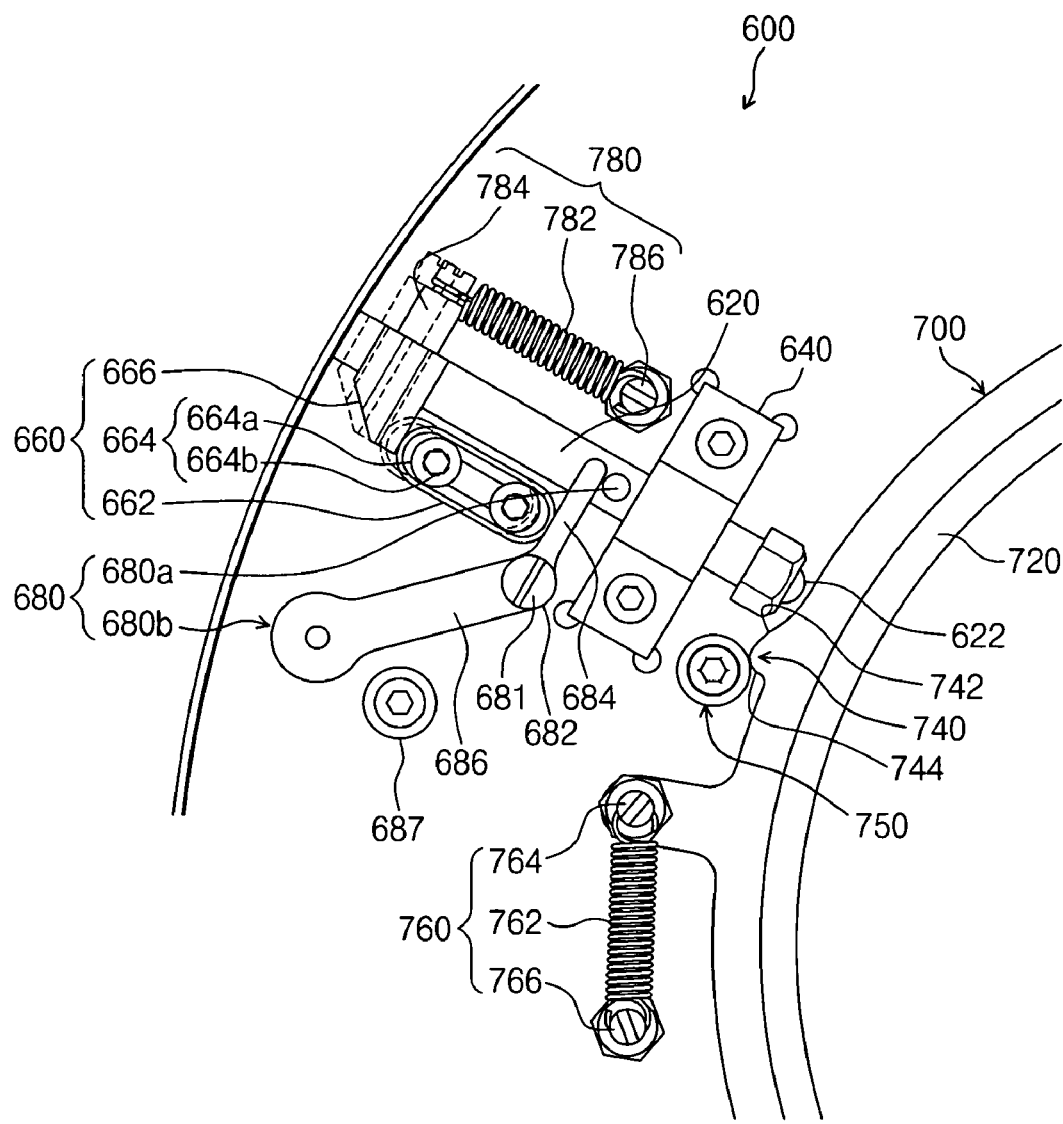
FIG. 22 is a view illustrating how the supporting position of the chuck pin is changed by moving an adjustment block according to an embodiment of the present invention.
Figure 23:
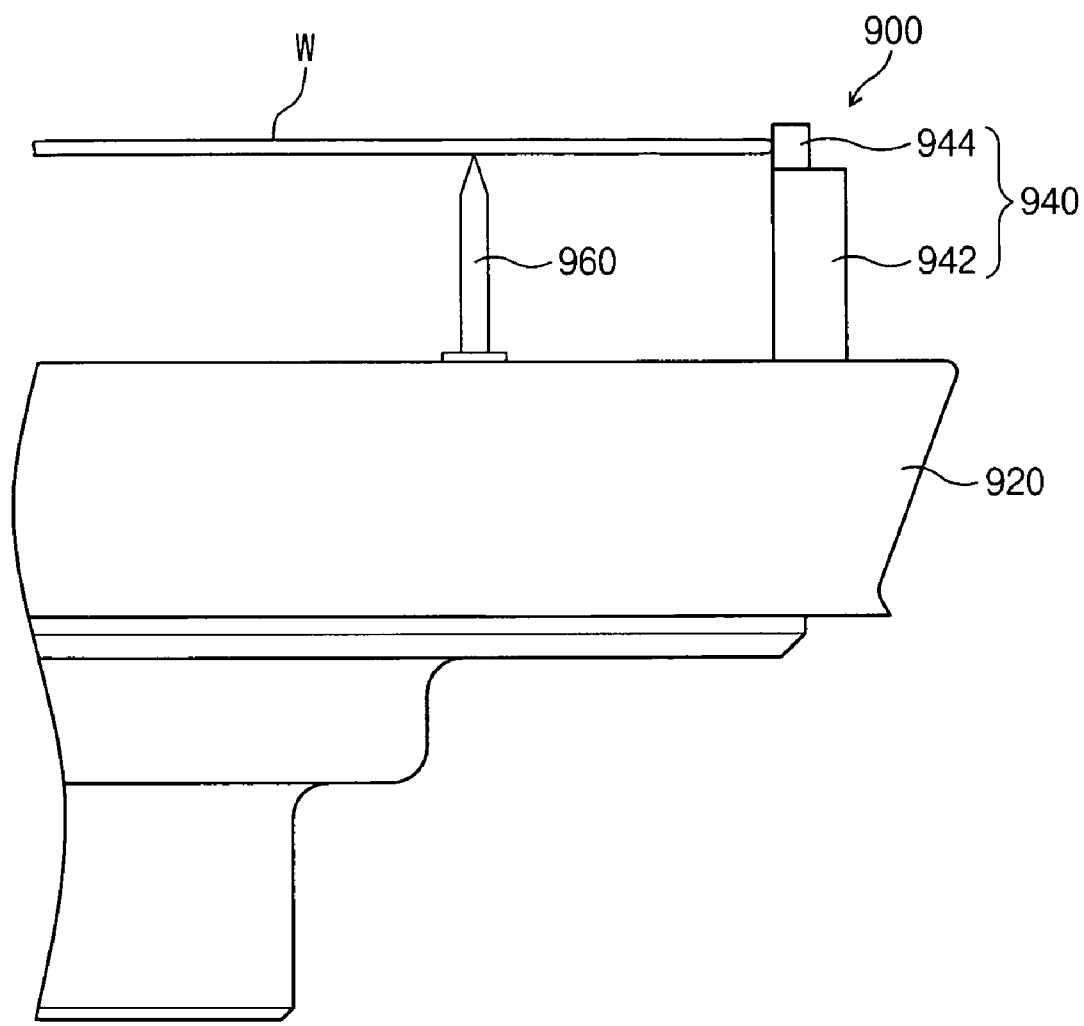
FIG. 23 is a schematic view illustrating a typical spin head.
Figure 24:
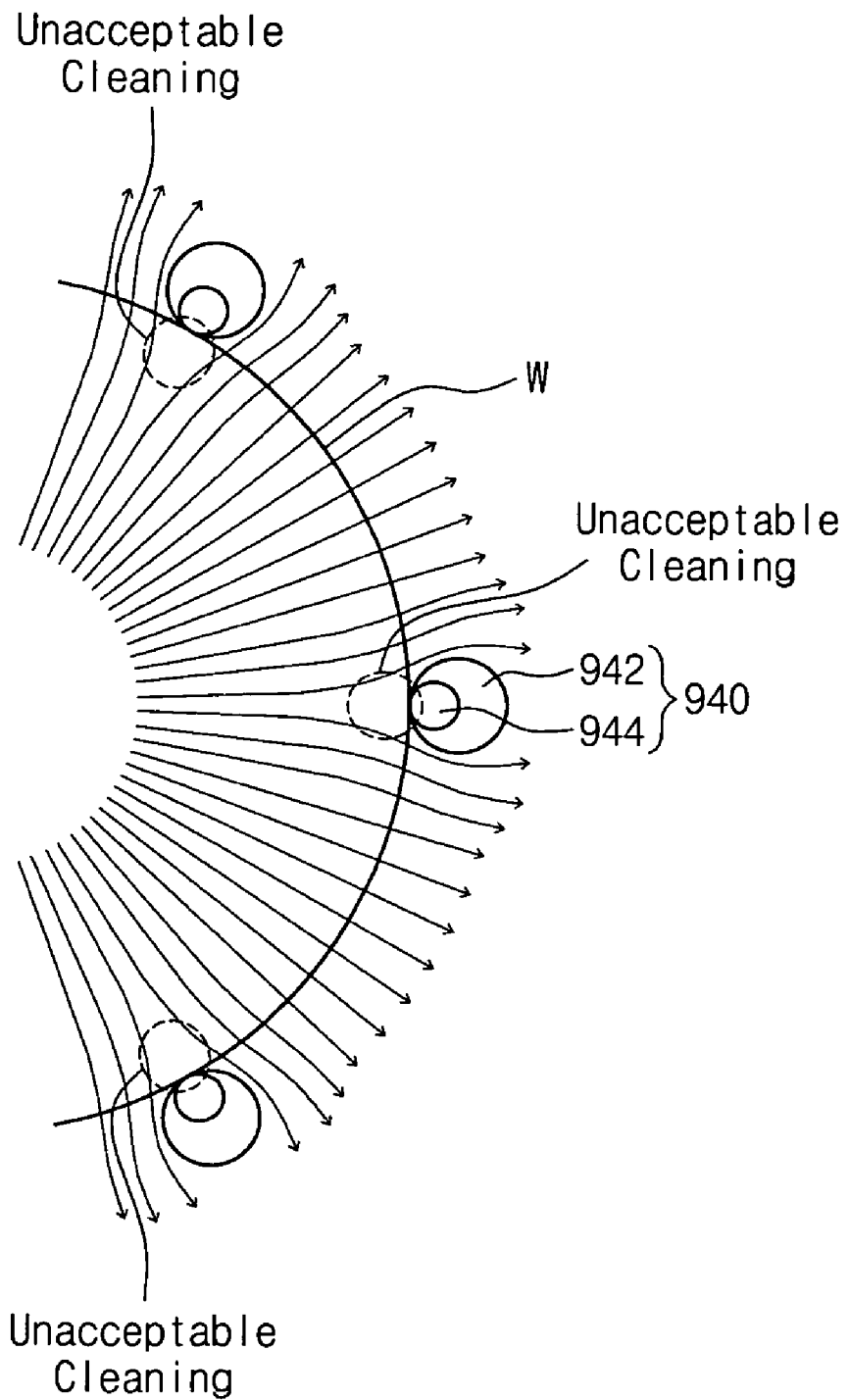
FIG. 24 is a view for explaining disadvantages of chuck pins such as those depicted in FIG. 23.
Figure 25:
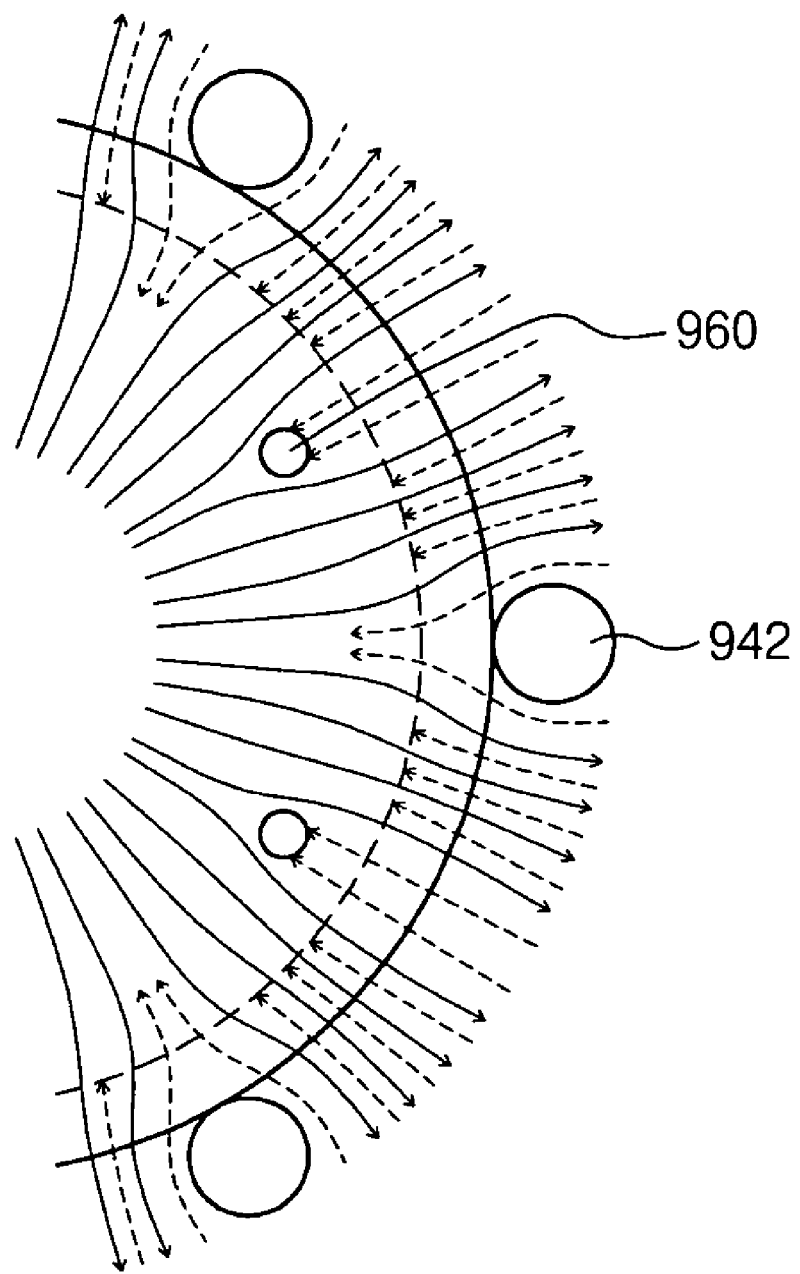
FIG. 25 is a view for explaining disadvantages of support pins such as those depicted in FIG. 23.

The supporting position of the chuck pin 500 can be adjusted as follows. First, the fixing member 664 is unfastened to remove a pressing force applied to the adjustment block 662 by the head portion 664a of the fixing member 664. Next, the adjustment block 662 is moved to a desired position. If the adjustment block 662 is moved away from the center of the body 300 in a radial direction of the body 300, the supporting position of the chuck pin 500 is also moved away from the center of the body 300. On the other hand, if the adjustment block 662 is moved toward the center of the body 300 in the radial direction of the body 300, the supporting position of the chuck pin 500 is also moved toward the center of the body 300. Then, the fixing member 664 is fastened to fix the adjustment block 662 to the body 300. FIG. 22 is a view illustrating how the supporting position of the chuck pin 500 is changed by moving the adjustment block 662 according to an embodiment of the present invention. In FIG. 22, components are indicated by solid lines before the adjustment block 662 is moved. After the adjustment block 662 is moved, moved components are indicated by dashed lines.

According to the present invention, although the chuck pins are in contact with the edge of a substrate for supporting the substrate, a process liquid can be smoothly supplied to contact regions between the chuck pins and the substrate so that the substrate can be uniformly treated.

Furthermore, according to the present invention, a bottom edge region of a substrate can be uniformly treated using a process liquid that is directed to the bottom surface of the substrate after being used to treat the top surface of the substrate.

Moreover, according to the present invention, when a substrate is supported by the chuck pins, all the chuck pins can stably make contact with the edge of the substrate. Therefore, the substrate can be stably supported, and stress concentration on some of the chuck pins can be prevented.

In addition, according to the present invention, even when a substrate is rotated at high speed, the chuck pins can be stably held in the supporting positions and make contact with the edge of the substrate.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A spin head for supporting a substrate, comprising:
a rotatable body; and
chuck pins protruding upward from the body and configured to support an edge of a substrate placed at the body when the body is rotated,
wherein each of the chuck pins includes:
a vertical rod vertically disposed at the body; and
a support rod extending from a side of the vertical rod and configured to make contact with the edge of the substrate placed at the body when the body is rotated,
the support rod includes:
a horizontal rod extending laterally from the vertical rod; and
a contact rod bent downward from an end of the horizontal rod,
wherein the contact rod is spaced apart from the vertical rod, and
wherein the contact rod and the vertical rod are generally parallel to each other.

2. The spin head of claim 1, wherein the support rod comprises a contact portion extending to an end of the support rod, the contact portion tapering toward the end of the support rod when viewed from a top of the support rod.

3. The spin head of claim 2, wherein the contact portion comprises a rounded side surface in a length direction of the support rod.

4. The spin head of claim 2, wherein the contact portion comprises a streamlined side surface in a length direction of the support rod.

5. The spin head of claim 2, wherein the support rod has a uniform height from a top surface of the body in a length direction of the support rod.

6. The spin head of claim 2, wherein the support rod comprises a distal end that is viewed as a point when viewed from the top of the support rod.

7. The spin head of claim 1, wherein the support rod tapers from the side of the vertical rod to an end thereof when viewed from a top of the support rod.

8. The spin head of claim 1, wherein a cross sectional area of the contact rod is constant in a length direction of the contact rod.

9. The spin head of claim 1, wherein the contact rod tapers away from the vertical rod.

10. The spin head of claim 9, wherein the vertical rod has a circular section, and the contact rod has a width smaller than a diameter of the circular section of the vertical rod when viewed from a top of the contact rod.

11. The spin head of claim 1, wherein the contact rod comprises a streamlined side surface.

12. The spin head of claim 1, further comprising a chuck pin moving unit configured to move the chuck pins in radial directions of the body,
    wherein the chuck pin moving unit comprises:
    movable rods fixed to the chuck pins;
    a rotatable cam comprising protrusions on an outer surface thereof so as to move the chuck pins away from a center of the body; and
    chuck pin return units applying forces to the movable rods, respectively, so as to individually move the chuck pins toward the center of the body.

13. The spin head of claim 12, wherein the chuck pin moving unit further comprises contact maintaining members, the contact maintaining members being configured to push the chuck pins toward the center of the body when the body is rotated so as to prevent the chuck pins from moving away from the center of the body by a centrifugal force.

14. The spin head of claim 1, wherein the body comprises a lower nozzle member through which gas is injected so as to space the substrate apart from the body.

15. The spin head of claim 14, wherein the lower nozzle member comprises an injection hole formed in a top surface of the body into a circular shape.

16. The spin head of claim 15, wherein the lower nozzle member further comprises:
    a passage portion connected to a gas supply conduit and having the same cross section along a length thereof; and
    an injection portion extending upward from the passage portion and connected to the injection hole, the injection portion having a gradually increasing cross section along an upward direction.

17. The spin head of claim 1, wherein the support rod extends from the side of the vertical rod at a top end of the vertical rod.

18. The spin head of claim 1, wherein a distal end of the support rod, having a smaller height than a height of the vertical rod, contacts the edge of the substrate.

19. A chuck pin used in a rotatable spin head for supporting an edge of a substrate, the chuck pin comprising:
    a vertical rod disposed in a vertical direction; and
    a support rod extending from a side of the vertical rod, the support rod includes:
        a horizontal rod extending laterally from the vertical rod; and
        a contact rod bent downward from an end of the horizontal rod,
        wherein the contact rod is spaced apart from the vertical rod, and
        wherein the contact rod and the vertical rod are generally parallel to each other.

20. The chuck pin of claim 19, wherein the support rod comprises a contact portion extending to an end of the support rod, the contact portion tapering toward the end of the support rod.

21. The chuck pin of claim 20, wherein the contact portion comprises a rounded side surface in a length direction of the support rod.

22. The chuck pin of claim 20, wherein the contact portion comprises a streamlined side surface.

23. The chuck pin of claim 20, wherein the support rod has a uniform height in a length direction thereof.

24. The chuck pin of claim 19, wherein the contact rod tapers away from the vertical rod.

25. The chuck pin of claim 24, wherein a cross sectional area of the contact rod is constant in a length direction of the contact rod.

26. The chuck pin of claim 24, wherein the contact rod comprises a streamlined side surface.

27. A method for treating a substrate, the method comprising supporting a substrate placed at a body of a spin head by brining chuck pins into contact with an edge of the substrate, wherein each of the chuck pins includes a vertical rod vertically disposed at the body and a support rod extending from a side of the vertical rod, the support rod includes a horizontal rod extending laterally from the vertical rod and a contact rod bent downward from an end of the horizontal rod, wherein the contact rod is spaced apart from the vertical rod, and wherein the contact rod and the vertical rod are generally parallel to each other, and
    wherein when the chuck pin supports the substrate, the vertical rod is spaced apart from the substrate in a lateral direction, and a distal end of the support rod is brought into contact with the edge of the substrate.

28. The method of claim 27, wherein the support rod comprises a contact portion extending to an end of the support rod in a tapered shape when viewed from a top of the support rod, and the contact portion is horizontally disposed at the same height as the substrate placed at the spin head.

29. The method of claim 27, wherein the support rod comprises:
    a horizontal rod extending laterally from the vertical rod; and
    a contact rod bent downward from an end of the horizontal rod,
    wherein the horizontal rod is horizontally disposed higher than the substrate placed at the spin head, and the contact rod extends downward to a level of the substrate placed at the spin head or lower than the level of the substrate placed at the spin head.

30. The method of claim 29, wherein the contact rod tapers away from the vertical rod when viewed form a top of the contact rod.

31. The method of claim 30, wherein the contact rod has the same cross section along a length thereof.

32. The method of claim 27, wherein the substrate is placed at the spin head with a patterned side of the substrate facing downward, and a process liquid is supplied to a top center portion of the substrate when the spin head is rotated.

33. The method of claim 32, wherein the substrate is spaced a predetermined distance from the spin head by a pressure of gas injected upward from the spin head.

* * * * *